(12) United States Patent
Andosca

(10) Patent No.: US 9,362,480 B2
(45) Date of Patent: Jun. 7, 2016

(54) SYMMETRIC DUAL PIEZOELECTRIC STACK MICROELECTROMECHANICAL PIEZOELECTRIC CANTILEVER ENERGY HARVESTER

(71) Applicant: MicroGen Systems, Inc., West Henrietta, NY (US)

(72) Inventor: Robert G. Andosca, Fairport, NY (US)

(73) Assignee: MicroGen Systems, Inc., West Henrietta, NY (US)

( * ) Notice: Subject to any disclaimer, the term of this patent is extended or adjusted under 35 U.S.C. 154(b) by 253 days.

(21) Appl. No.: 14/201,202

(22) Filed: Mar. 7, 2014

(65) Prior Publication Data

US 2014/0265726 A1   Sep. 18, 2014

Related U.S. Application Data

(60) Provisional application No. 61/780,176, filed on Mar. 13, 2013.

(51) Int. Cl.
| | |
|---|---|
| *H01L 41/113* | (2006.01) |
| *H01L 41/047* | (2006.01) |
| *H01L 41/083* | (2006.01) |
| *H01L 41/27* | (2013.01) |
| *H02N 2/18* | (2006.01) |

(52) U.S. Cl.
CPC ........ *H01L 41/1136* (2013.01); *H01L 41/0475* (2013.01); *H01L 41/0831* (2013.01); *H01L 41/27* (2013.01); *H02N 2/188* (2013.01); *Y10T 29/42* (2015.01)

(58) Field of Classification Search
USPC ................................................. 310/311–371
See application file for complete search history.

(56) References Cited

U.S. PATENT DOCUMENTS

| | | |
|---|---|---|
| 4,445,256 A | 5/1984 | Huguenin et al. |
| 5,248,912 A | 9/1993 | Zdeblick et al. |
| 5,646,583 A | 7/1997 | Seabury et al. |
| 6,396,201 B1 | 5/2002 | Ide et al. |
| 6,796,011 B2 | 9/2004 | Takeuchi et al. |
| 6,858,970 B2 | 2/2005 | Malkin et al. |
| 7,919,345 B1 | 4/2011 | Kirsten et al. |
| 8,080,920 B2 | 12/2011 | Andosca et al. |

(Continued)

OTHER PUBLICATIONS

International Search Report, corresponding to PCT/US14/65628, mailed Jul. 24, 2015.

(Continued)

*Primary Examiner* — Thomas Dougherty
(74) *Attorney, Agent, or Firm* — LeClairRyan, a Professional Corporation

(57) ABSTRACT

The present invention relates to an energy harvester device comprising an elongate resonator beam extending between first and second ends. A base connected to the resonator beam at the first end with the second end being freely extending from the base as a cantilever. A mass is attached to the second end of the elongate resonator beam. The elongate resonator beam comprises either: (1) a first oxide layer on a first piezoelectric stack layer over a cantilever layer on a second oxide layer over a second piezoelectric stack layer on a third oxide layer or (2) a first oxide layer on a first piezoelectric stack layer over a second oxide layer on a cantilever layer over a third oxide layer on a second piezoelectric stack over a fourth oxide layer. Also disclosed is a system comprising an electrically powered apparatus and the energy harvester device, as well as methods of making and using the energy harvester.

23 Claims, 16 Drawing Sheets

(56) References Cited

U.S. PATENT DOCUMENTS

| | | | |
|---|---|---|---|
| 8,319,402 | B1 | 11/2012 | Churchill et al. |
| 2003/0134738 | A1* | 7/2003 | Furukawa ............ C04B 35/462 501/135 |
| 2004/0115711 | A1 | 6/2004 | Su et al. |
| 2005/0134149 | A1 | 6/2005 | Deng et al. |
| 2007/0125176 | A1 | 6/2007 | Liu |
| 2009/0200896 | A1 | 8/2009 | Morris et al. |
| 2009/0284102 | A1 | 11/2009 | Karakaya et al. |
| 2010/0019623 | A1 | 1/2010 | Yao et al. |
| 2010/0072759 | A1 | 3/2010 | Andosca et al. |
| 2010/0194240 | A1 | 8/2010 | Churchill et al. |
| 2010/0295419 | A1* | 11/2010 | Fujii .................. H01L 41/1136 310/339 |
| 2011/0264293 | A1 | 10/2011 | Arms et al. |
| 2011/0277286 | A1 | 11/2011 | Zhang |
| 2011/0309618 | A1 | 12/2011 | Gieras et al. |
| 2012/0049694 | A1 | 3/2012 | Van Schaijk et al. |
| 2013/0088123 | A1 | 4/2013 | Haskett |
| 2013/0341936 | A1 | 12/2013 | Wood et al. |
| 2014/0265726 | A1 | 9/2014 | Andosca |

OTHER PUBLICATIONS

International Search Report for International Patent Application No. PCT/US2014/035318 (Dec. 31, 2014).

Altena G., et al., "Design improvements for an electret-based MEMS vibrational electrostatic energy harvester", Journal of Physics: Conference Series 476 (2013) 012078, PowerMEMS2013, pp. 371-374, IOP Publishing.

Andosca R., et al., "Experimental and theoretical studies on MEMS piezoelectric vibrational energy harvesters with mass loading", Sensors and Actuators A: Physical, 2012, pp. 1-12, Elsevier B.V.

Beeby et al., "Energy harvesting vibration sources for microsystems applications," Meas. Sci. Technol., Measurement Science and Technology, 2006, pp. R175-R195, IOP Publishing Ltd.

Elfrink R., et al., "Vaccum Packaged MEMS Piezoelectric Vibration Energy Harvester", PowerMEMS, 2009, pp. 67-70.

Gu L., et al., "Impact-driven, frequency up-converting coupled vibration energy harvesting device for low frequency operation", Smart Mater, Struct., 20, Mar. 8, 2011, pp. 1-10, IOP Publishing.

Marzencki, M., et al., "A MEMS Piezoelectric Vibration Energy Harvesting Device", PowerMEMS, Nov. 28-30, 2005, pp. 45-48.

Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.

Schroder C., et al., "Wafer-Level Packaging of ALN-Based Piezoelectric Micropower Generators", PowerMEMS, Dec. 2-5, 2012, pp. 343-346.

Schroder C., et al., "ALN-Based Piezoelectric Micropower Generator for Low Ambient Vibration Energy Harvesting", 2011, pp. 1-4.

Singh K., et al., "Piezoelectric vibration energy harvesting system with an adaptive frequency tuning mechanism for intelligent tires", Mechatronics 22, Jul. 31, 2012, pp. 970-988, Elsevier, Ltd.

Stoppel et al., "A1N-Based piezoelectric micropower generator for low ambient vibration energy harvesting," Porcedia Engineer. 25, Sep. 4-7, 2011, pp. 721-724, Elsevier, Ltd.

Tang L., et al., "Toward Broadband Vibration-based Energy Harvesting", Journal of Intelligent Material Systems and Structures, vol. 21, Dec. 2010, pp. 1867-1897, Sage Publications.

Schaijk, R., et al., "A MEMS vibration energy harvester for automotive applications", Proc. of SPIE vol. 8763, 2013, pp. 1-10.

Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.

Zhu D., et al., "Strategies for increasing the operating frequency range of vibration energy harvesters: a review", Meas. Sci. Technol. 21, Dec. 15, 2010, pp. 1-29, IOP Publishing.

International Search Report for International Patent Application No. PCT/US2014/014797 (May 23, 2014).

International Search Report for International Patent Application No. PCT/US2013/78520 (May 4, 2014).

International Search Report for International Patent Application No. PCT/US2014/021905 (Aug. 15, 2014).

International Search Report for International Patent Application No. PCT/US2014/035296 (Aug. 22, 2014).

* cited by examiner

SYMMETRIC DUAL PIEZOELECTRIC STACK MICROELECTROMECHANICAL PIEZOELECTRIC CANTILEVER ENERGY HARVESTER

This application claims the benefit of U.S. Provisional Patent Application Ser. No. 61/780,176, filed Mar. 13, 2013, which is hereby incorporated by reference in its entirety.

FIELD OF THE INVENTION

The present invention relates to a symmetric dual piezoelectric stack microelectromechanical piezoelectric cantilever energy harvester.

BACKGROUND OF THE INVENTION

Reduction in both size and power consumption of integrated circuits has led to the proliferation of low power sensors and wireless technology. For example, there are a wide variety of devices using low-power sensors, electronics, and wireless transmitters, separately or in combination, including tablets; smartphones; cell phones; laptop computers; MP3 players; telephony headsets; headphones; routers; gaming controllers; mobile internet adaptors; wireless sensors; tire pressure sensor monitors; wearable sensors that communicate with tablets, PCs, and/or smartphones; devices for monitoring livestock; medical devices; human body monitoring devices; toys; etc. Each of these devices requires a standalone power supply to operate. Typically, power supplies for these devices are electrical batteries, often replaceable batteries.

Other wireless technologies of significant interest are wireless sensors and wireless sensor networks. In such networks, wireless sensors are distributed throughout a particular environment to form an ad hoc network that relays measurement data to a central hub. Particular environments include, for example, an automobile, an aircraft, a factory, or a building. A wireless sensor network may include several to tens of thousands of wireless sensor "nodes" that operate using multi-hop transmissions over distances. Each wireless node will generally include a sensor, wireless electronics, and a power source. These wireless sensor networks can be used to create an intelligent environment responding to environmental conditions.

A wireless sensor node, like the other wireless devices mentioned above, requires standalone electrical power to operate the electronics of that node. Conventional batteries, such as lithium-ion batteries, zinc-air batteries, lithium batteries, alkaline batteries, nickel-metal-hydride batteries, and nickel-cadmium batteries, could be used. However, it may be advantageous for wireless sensor nodes to function beyond the typical lifetime of such batteries. In addition, battery replacement can be burdensome, particularly in larger networks with many nodes.

Alternative standalone power supplies rely on scavenging (or "harvesting") energy from the ambient environment. For example, if a power-driven device is exposed to sufficient light, a suitable alternative standalone power supply may include photoelectric or solar cells. Alternatively, if the power-driven device is exposed to sufficient air movement, a suitable alternative standalone power supply may include a turbine or micro-turbine for harvesting power from the moving air. Other alternative standalone power supplies could also be based on temperature fluctuations, pressure fluctuations, or other environmental influences.

Some environments do not include sufficient amounts of light, air movement, temperature fluctuation, and/or pressure variation to power particular devices. Under such environments, the device may nevertheless be subjected to fairly predictable and/or constant vibrations, e.g., emanating from a structural support, which can be in the form of either a vibration at a constant frequency, or an impulse vibration containing a multitude of frequencies. In such cases, a scavenger (or harvester) that essentially converts movement (e.g., vibrational energy) into electrical energy can be used.

One particular type of vibrational energy harvester utilizes resonant beams that incorporate a piezoelectric material that generates electrical charge when strained during resonance of the beams caused by ambient vibrations (driving forces).

Microelectromechanical ("MEMS") piezoelectric energy harvesters with silicon cantilevers typically have a cross-section consisting at least of oxide/cantilever material/piezoelectric stack/oxide (the oxide is typically deposited silicon dioxide). The silicon material used for the cantilever is typically formed from the single crystalline silicon device layer of a silicon-on-insulator ("SOI") wafer. A second piezoelectric stack is often placed in the device structure to form a dual piezoelectric stack in order to increase the power output from the energy harvester. The additional piezoelectric stack is placed on the same side of the cantilever as the first piezoelectric stack (or on top of the first piezoelectric stack), in the format of at least oxide/cantilever material/piezoelectric stack/oxide/piezoelectric stack/oxide. The additional piezoelectric stack is placed in this manner because during the process used to fabricate SOI wafers, direct bonding of two silicon wafers at high temperature, followed by grinding and polishing steps, makes it extremely difficult to place piezoelectric stacks in between the device and handle wafers.

Placement of the additional piezoelectric stack on the same side of the cantilever as the first piezoelectric stack creates a lack of symmetry in cross-section with respect to the piezoelectric stack, requiring the piezoelectric stack residual stress to be tuned in order to engineer the flatness of the cantilever. Curl or lack of flatness in the cantilever due to poor management of residual stress in the layers can impact the performance of the MEMS energy harvester. Tuning the residual stress of the piezoelectric stack can also impact its inherent piezoelectric properties and, thus, device performance. A tradeoff must, therefore, be made in the stresses required for cantilever flatness and for quality piezoelectric response.

The present invention is directed to overcoming these and other deficiencies in the art.

SUMMARY OF THE INVENTION

One aspect of the present invention relates to an energy harvester device comprising an elongate resonator beam extending between first and second ends. A base is connected to the resonator beam at the first end with the second end being freely extending from the base as a cantilever. A mass is attached to the second end of the elongate resonator beam. The elongate resonator beam comprises either: (1) a first oxide layer on a first piezoelectric stack layer over a cantilever layer on a second oxide layer over a second piezoelectric stack layer on a third oxide layer or (2) a first oxide layer on a first piezoelectric stack layer over a second oxide layer on a cantilever layer over a third oxide layer on a second piezoelectric stack over a fourth oxide layer.

Another aspect of the present invention relates to a system comprising an electrically powered apparatus and the energy harvester device of the present invention coupled to the electrically powered apparatus.

A further aspect of the present invention relates to a method of powering an electrically powered apparatus. This method involves providing the system according to the present invention and subjecting the system to movement or vibrations to generate electrical energy from the first and/or second piezoelectric stack layer. Electrical energy is transferred from the first and/or second piezoelectric stack layer to the apparatus to provide power to the apparatus.

Another aspect of the present invention relates to a method of producing an energy harvesting device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A cantilever material is deposited over the deposited second silicon dioxide layer and patterned. A second piezoelectric stack layer is deposited over the patterned cantilever material and the second piezoelectric stack layer is patterned. The second side surface of the silicon wafer is etched to produce the energy harvesting device.

The energy harvester device of the present invention provides a dual piezoelectric stack energy harvester with a symmetric cross-section fabricated using a thick deposited layer of metal, silicon, or other CMOS compatible material for the cantilever, and one piezoelectric stack on either surface of the cantilever layer. This structure provides increased power from the harvester with the advantage of nearly independent control of piezoelectric layer stress (and therefore piezoelectric properties) from cantilever flatness, which leads to better device performance and a more robust manufacturing process. The power output of the piezoelectric energy harvester can be increased with better control over the cantilever flatness and consequently, better overall performance.

DETAILED DESCRIPTION OF THE INVENTION

The present invention relates to a symmetric dual piezoelectric stack MEMS piezoelectric cantilever energy harvester device, a system comprising the energy harvester device, and methods of using and making the energy harvester device.

One aspect of the present invention relates to an energy harvester device comprising an elongate resonator beam extending between first and second ends. A base is connected to the resonator beam at the first end with the second end being freely extending from the base as a cantilever. A mass is attached to the second end of the elongate resonator beam. The elongate resonator beam comprises either: (1) a first oxide layer on a first piezoelectric stack layer over a cantilever layer on a second oxide layer over a second piezoelectric stack layer on a third oxide layer or (2) a first oxide layer on a first piezoelectric stack layer over a second oxide layer on a cantilever layer over a third oxide layer on a second piezoelectric stack over a fourth oxide layer.

Figure 1:
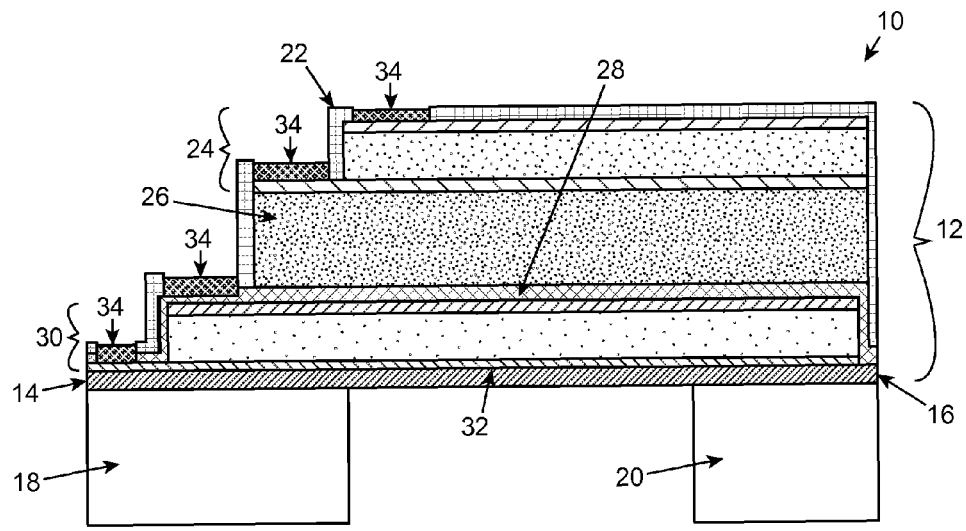
FIG. 1 is a side view of a first embodiment of an energy harvester device of the present invention with an elongate resonator beam comprising a first oxide layer on a first piezoelectric stack layer over a cantilever layer on a second oxide layer over a second piezoelectric stack layer on a third oxide layer.

FIG. 1 is a side view of a first embodiment of energy harvester device 10 of the present invention. Energy harvester device 10 includes elongate resonator beam 12. Resonator beam 12 extends between first end 14 and second end 16. Base 18 is connected to resonator beam 12 at first end 14 with second end 16 being freely extending from base 18 as a cantilever. Energy harvester device 10 also includes mass 20 attached to second end 16 of resonator beam 12.

Resonator beam 12 comprises a laminate formed by a plurality of layers. According to one embodiment, resonator beam 12 includes at least first oxide layer 22 on first piezoelectric stack layer 24 over cantilever layer 26 on second oxide layer 28 over second piezoelectric stack layer 30 on third oxide layer 32. Non-limiting examples of other layers include those described below with respect to the method of forming an energy harvester device of the present invention as shown in FIGS. 4-17.

First oxide layer 22, according to one embodiment, is a silicon layer with a thickness of about 1 μm. According to another embodiment, first oxide layer is optional and its presence provides robustness to the structure against abrasion. Second oxide layer 28 is, according to one embodiment, a high temperature oxide layer with a thickness of about 1 μm. This layer provides electrical isolation of the second piezoelectric stack layer 30. Third oxide layer 32 is a thermal oxide layer. In one embodiment, third dioxide layer 32 has a thickness of about 0.25 μm to about 2 μm.

Cantilever material layer 26 may be any suitable material such as silicon, polySi, metal (e.g., Cu or Ni), or other metal oxide semiconductor (CMOS) compatible material, or a high temperature polymer such as polyimide. In one embodiment, cantilever material 26 has a thickness range of about 10 μm to about 200 μm, about 10 μm to about 75 μm, or about 10 μm to about 50 μm.

First and second piezoelectric stacks 24 and 30 of the resonator beam 12 include a piezoelectric material. Suitable piezoelectric materials include, without limitation, aluminum nitride, zinc oxide, PVDF, and lead zirconate titinate based compounds. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference* (London, UK) pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} \text{m/V}$$

(Beeby et al., "Energy Harvesting Vibration Sources for Microsystems Applications," *Meas. Sci. Technol.* 17:R175-R195 (2006), which is hereby incorporated by reference in its entirety).

First and second piezoelectric stacks 24 and 30 of the resonator beam 12 also include one or more electrodes 34 in electrical contact with the first and/or second piezoelectric stack layers 24 and 30. According to one embodiment, electrodes 34 comprise a material selected from the group consisting of molybdenum and platinum, although other materials suitable for forming electrode structures may also be used. In addition, energy harvester device 10 may further include electrical harvesting circuitry in electrical connection with one or more electrodes 34 to harvest electrical energy from the piezoelectric material of resonator beam 12. As described in further detail below, the electrical harvesting circuitry can be electrically coupled to an electrically powered apparatus to provide power generated from the piezoelectric material and supplied to the apparatus.

In the energy harvester device of the present invention, resonator beam 12 has second end 16, which is freely extending from base 18 as cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of mass 20 attached at second end 16 of resonator beam 12.

Resonant frequencies of resonator beam 12 of energy harvester device 10 of the present invention in operation may include frequencies of about 50 Hz to about 4,000 Hz, about 100 Hz to about 3,000 Hz, about 100 Hz to about 2,000 Hz, or about 100 Hz to about 1,000 Hz.

Resonator beam 12 may have sidewalls that take on a variety of shapes and configurations to help tune resonator beam 12 and to provide structural support. According to one embodiment, resonator beam 12 has sidewalls which are continuously curved within the plane of resonator beam 12, as described in U.S. Provisional Patent Application Ser. No. 61/780,203, which is hereby incorporated by reference in its entirety.

Energy harvester device 10 of the present invention includes mass 20 at second end 16 of resonator beam 12. Mass 20 is provided to lower the frequency of resonator beam 12 and also to increase the power output of resonator beam 12 (i.e., generated by the piezoelectric material). Mass 20 may be constructed of a single material or multiple materials (e.g., layers of materials). According to one embodiment, mass 20 is formed of silicon wafer material. Other suitable materials include, without limitation, copper, gold, and nickel deposited by electroplating or thermal evaporation.

In one embodiment, a single mass 20 is provided per resonator beam 12. However, more than one mass 20 may also be attached to resonator beam 12. In other embodiments, mass 20 is provided, for example, at differing locations along resonator beam 12.

As those skilled in the art will readily appreciate, resonator beam 12 can be tuned by varying any one or more of a number of parameters, such as the cross-sectional shape of resonator beam 12, cross-sectional dimensions of resonator beam 12, the length of resonator beam 12, the mass of mass 20, the location of mass 20 on resonator beam 12, and the materials used to make resonator beam 12.

In operation, one or more electrodes 34 harvest charge from the piezoelectric materials of resonator beam 12 as resonator beam 12 is subject to movement. Accordingly, electrodes 34 are in electrical connection with the piezoelectric materials of resonator beam 12.

Electrical energy collected from the piezoelectric materials of resonator beam 12 is then communicated to electrical harvesting circuitry also formed on energy harvester device 10 at or near electrodes 34.

Figure 2:
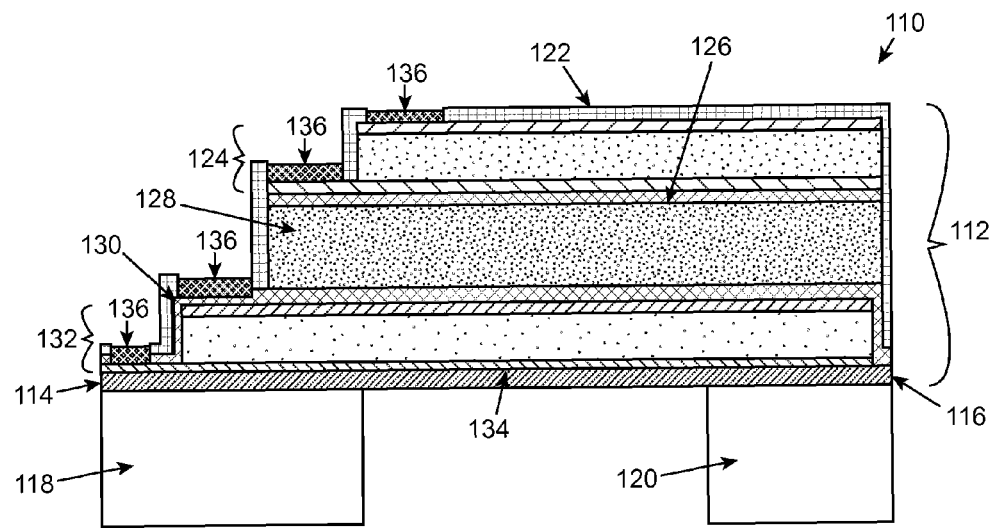
FIG. 2 is a side view of a second embodiment of an energy harvester device of the present invention with an elongate resonator beam comprising a first oxide layer on a first piezoelectric stack layer over a second oxide layer on a cantilever layer over a third oxide layer on a second piezoelectric stack over a fourth oxide layer.

FIG. 2 illustrates an alternative embodiment of an energy harvester device of the present invention. Specifically, energy harvester 110 includes elongate resonator beam 112. Resonator beam 112 extends between first end 114 and second end 116. Base 118 is connected to resonator beam 112 at first end 114 with second end 116 being freely extending from base 118 as a cantilever. Energy harvester device 110 also includes mass 120 attached to second end 116 of resonator beam 112. Energy harvester 110 is the same as energy harvester 10 as described above with respect to FIG. 1, except as described below with respect to resonator beam 112. Specifically, energy harvester 110 comprises resonator beam 112, which includes an different layering of materials as described below with respect to FIG. 2.

Resonator beam 112 comprises a laminate formed of a plurality of layers. According to one embodiment, resonator beam 112 includes first oxide layer 122 on first piezoelectric stack 124 layer over second oxide layer 126 on cantilever layer 128 over third oxide layer 130 on second piezoelectric stack 132 over fourth oxide layer 134. Non-limiting examples of other layers include those described below with respect to the method of forming an energy harvester device of the present invention as shown in FIGS. 18-33.

The layers of resonator beam 112 are substantially the same as the layers of resonator beam 12, except as described below with respect to FIG. 2. Specifically, resonator beam 112 includes the addition of second oxide layer 126 between first piezoelectric stack layer 124 and cantilever layer 128. Second oxide layer 126 is according to one embodiment, a high temperature oxide layer with a thickness of about 1 μm. This layer provides electrical isolation of the first piezoelectric stack layer 124. Third oxide layer 130 and fourth oxide layer 134 are the same as second oxide layer 28 and third oxide layer 32, respectively, as described above with respect to FIG. 1.

First and second piezoelectric stacks 124 and 132 of resonator beam 112 also include one or more electrodes 136 in electrical contact with the first and/or second piezoelectric stack layers 124 and 132. According to one embodiment, electrodes 136 comprise a material selected from the group consisting of molybdenum and platinum, although other materials suitable for forming electrode structures may also be used. In addition, energy harvester device 110 may further include electrical harvesting circuitry in electrical connection with one or more electrodes 136 to harvest electrical energy from the piezoelectric material of resonator beam 112.

Another aspect of the present invention relates to a system comprising an electrically powered apparatus and the energy harvester device of the present invention electrically coupled to the electrically powered apparatus.

Figure 3:
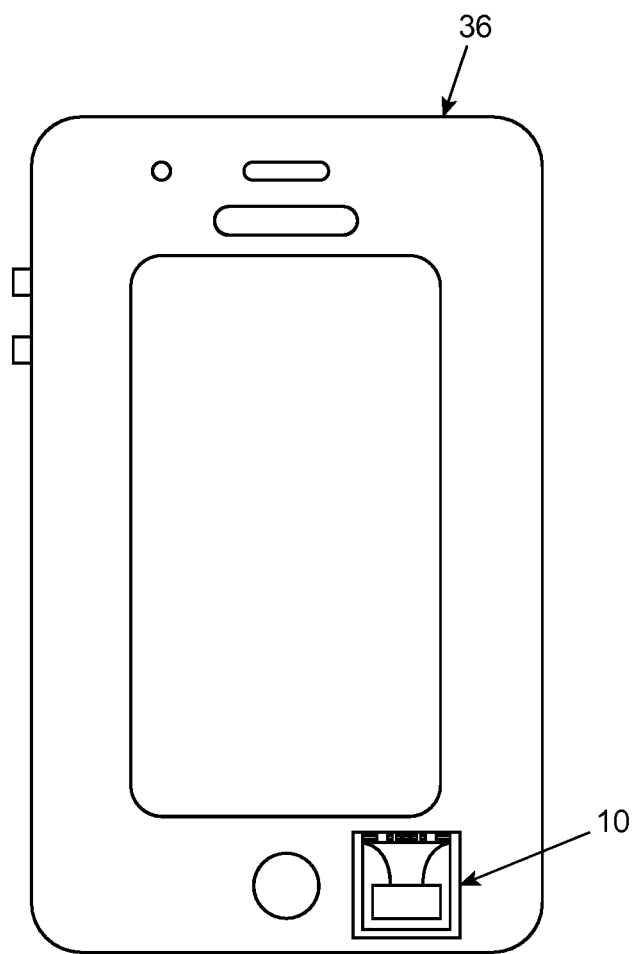
FIG. 3 illustrates one embodiment of a system of the present invention which includes an electrically powered smart phone containing an energy harvester device of the present invention which is electrically coupled to the smart phone to provide electrical energy to power the smart phone.

Turning now to FIG. 3, electrically powered apparatus (smartphone) 36 is shown to contain (within its exterior housing) energy harvester device 10. According to this embodiment, energy harvester device 10 provides a standalone source of energy to power smartphone 36, which is used in place of or in conjunction with another standalone energy source (e.g., a battery). In an alternative embodiment, the electrically powered apparatus is, for example, a wearable device, such as a wrist watch-type device or necklace that electronically communicates with a tablet, PC, and/or smartphone.

The energy harvester device of the present invention may also power an electrically powered apparatus by charging a battery associated with the electrically powered apparatus. For example, the energy harvester device may provide a trickle charge to a batter which powers the electrically powered apparatus.

Other systems of the present invention that include an electrically powered apparatus and the energy harvester device of the present invention are, without limitation: a laptop computer; a tablet computer; a cell phone; an e-reader; an MP3 player; a telephony headset; headphones; a router; a gaming device; a gaming controller; a mobile internet adapter; a camera; wireless sensors; wearable sensors that communicate with tablets, PCs, and/or smartphones; wireless sensor motes (for networks monitoring industrial, rail, buildings, agriculture, etc.); tire pressure sensor monitors; electronic displays (e.g., on power tools); agriculture devices for monitoring livestock; medical devices; human body monitoring devices; and toys.

The energy harvester of the present invention can be connected to such devices in substantially the same manner as shown in smart phone 36 of FIG. 3.

For example, according to one embodiment, the system of the present invention is a wireless sensor device containing a sensor to monitor, e.g., any one or more various environmental properties (temperature, humidity, light, sound, vibration, wind, movement, etc.). The energy harvester device of the present invention is coupled to the sensor to provide power to the sensor.

According to one example, the system of the present invention is a tire-pressure monitoring system containing a sensor to monitor tire pressure. The energy harvester device of the present invention is coupled to the sensor to provide power. Such a system may be formed as a small device mounted, e.g., on a wheel or tire of an automobile.

According to another example, the system of the present invention is a humidity sensor in communication with electronic controls of a household or commercial clothes drier. The energy harvester device of the present invention is coupled to the sensor to provide power. Such a system may be formed as a small device mounted, e.g., on the inside of a clothes drier to monitor the dryness of clothes based on humidity levels in the clothes drier. The sensor could then communicate with the electronic controls of the clothes drier to determine, e.g., the end of a cycle.

A further aspect of the present invention relates to a method of powering an electrically powered apparatus. This method involves providing the system of the present invention, subjecting the system to movement or vibrations to generate electrical energy from the piezoelectric material, and transferring the electrical energy from the piezoelectric material to the apparatus to provide power to the apparatus.

Another aspect of the present invention relates to a method of producing an energy harvesting device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A cantilever material is deposited over the deposited second silicon dioxide layer and patterned. A second piezoelectric stack layer is deposited over the patterned cantilever material and the second piezoelectric stack layer is patterned. The second side surface of the silicon wafer is etched to produce the energy harvesting device.

Figure 4:
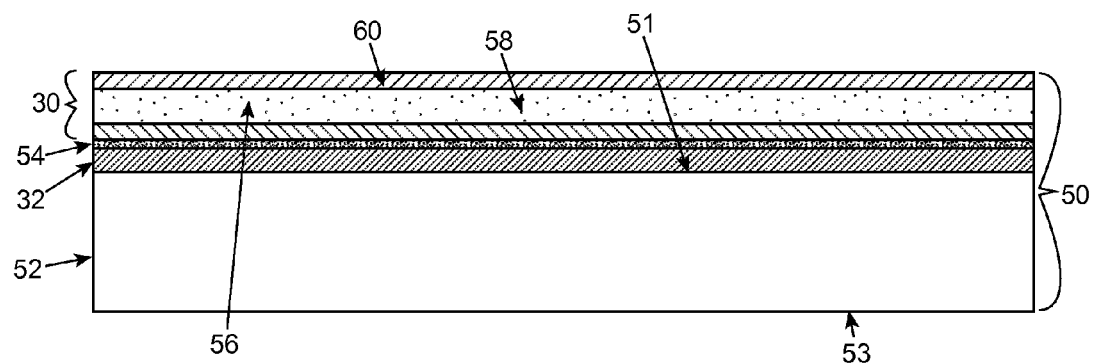
FIG. 4 is a side view of a layered material stack for producing a first embodiment of an energy harvester device of the present invention. The layered material stack includes a silicon wafer, a first silicon dioxide layer, an optional adhesion layer, and a first piezoelectric stack layer including a first metal layer, a piezoelectric material layer, and a second metal layer.

With reference now to FIG. 4, a first embodiment of the method of producing the energy harvester device of the present invention involves forming layered material stack 50, which is a stack of layered materials that is patterned to form an energy harvester device as described herein. Layered material stack 50 includes the following layered materials: silicon wafer 52 (which has first surface 51 and second surface 53), first silicon dioxide layer 32, adhesion layer 54 (which is optional), piezoelectric stack layer 30 (comprising first metal layer 56, piezoelectric material layer 58, and second metal layer 60).

As illustrated in FIG. 4, one embodiment the method of forming the energy harvester device of the present invention involves forming layered material stack 50 by providing silicon wafer 52 having first surface 51 and second surface 53, depositing first silicon dioxide layer 32 (it is to be understood that the numerical designations of the layers relate to the embodiment of the energy harvester of the present invention shown in FIG. 1) on first surface 51 of silicon wafer 52, depositing optional adhesion layer 54 on first silicon dioxide layer 32, and depositing first piezoelectric stack layer 30 on first silicon dioxide layer 32.

Silicon wafer 52 is, according to one embodiment, a single crystal double-sided polished silicon wafer. In one embodiment, silicon wafer 52 has a thickness of about 400 µm to about 1,000 µm, about 500 µm to about 900 µm, about 600 µm to about 800 µm, or about 700 µm. In one specific example, silicon wafer 52 is a double-sided polished silicon wafer having a thickness of approximately 725 µm (+/−15 µm) (i.e., the standard thickness for 8 inch wafers). Alternatively, in place of silicon wafer 52, the method of the present invention may begin with a deposited layer of silicon dioxide upon which the subsequent layers of layered material stack 50 are formed.

First silicon dioxide layer 32 is, according to one embodiment, a thermal oxide layer. In one embodiment, first silicon dioxide layer 32 has a thickness of about 0.25 µm to about 2 µm. Deposition of first silicon dioxide layer 32 onto first surface 51 of silicon wafer 52 can be carried out by methods known in the art. For example, silicon dioxide may be thermally grown and then deposited on the silicon wafer. In one particular example, one (1) µm (+/−0.05 µm) of thermally grown $SiO_2$ is deposited onto silicon wafer 52 to form silicon dioxide layer 32.

First piezoelectric stack layer 30 is deposited onto first silicon dioxide layer 32 to form a metal/piezoelectric material/metal layer. According to one embodiment, piezoelectric stack layer 30 has a thickness of about 0.5 µm to about 6 µm, or about 2 µm to about 5 µm in thickness. First piezoelectric stack layer 30 includes first metal layer 56, second metal layer 60, and piezoelectric layer 58. First metal layer 56 and second metal layer 60 may be formed of any suitable metals that adequately function as an electrode. According to one embodiment, these layers are formed of the same material, such as molybdenum or platinum. However, both layers need not be formed of the same material. Piezoelectric material layer 58 is formed of any suitable piezoelectric material, as discussed above. According to one embodiment, this layer is formed from aluminum nitride (AlN).

Deposition of first piezoelectric stack layer 30 may be carried out with thin adhesion layer 54 underneath as is standard in the art. Suitable adhesion layers 54 may include materials such as titanium, AlN, Al:Cu, or Al at a layer thickness of about 0.02 µm to about 0.05 µm.

One embodiment of the method of making an energy harvester device of the present invention proceeds as illustrated in FIGS. 5-17.

Figure 5:
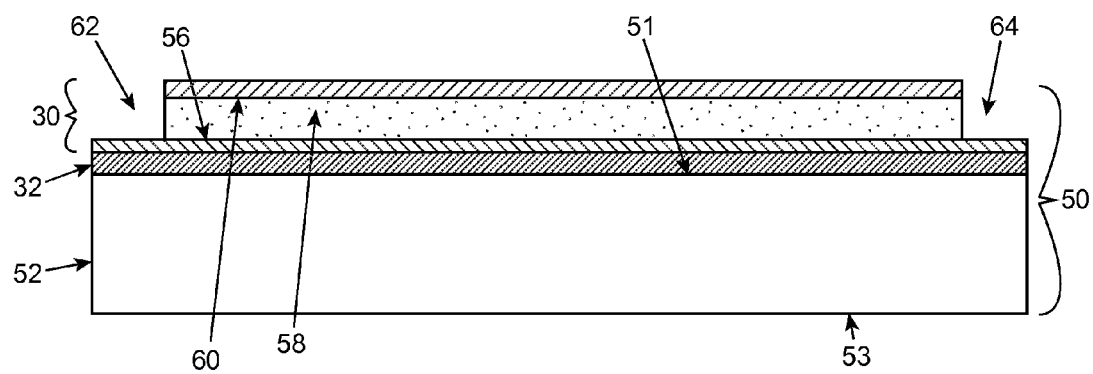
FIG. 5 is a side view of the layered material stack of FIG. 4 which has been patterned according to one embodiment of the method of producing an energy harvester device of the present invention, to remove portions of the piezoelectric material layer and metal layer(s) from the stack.

First, as shown in FIG. 5, piezoelectric stack layer 30 is patterned. In particular, portions (e.g., portions 62 and 64) of piezoelectric material layer 58 and second metal layer 60 are removed from stack 50 to expose first metal layer 56. Patterning first piezoelectric stack layer 30 according to the method of the present invention may be accomplished using lithography techniques combined with wet etch with phosphoric acid for the metal layers and tetramethylamoniumhydroxide. Other suitable chemistries for wet or dry etching of the layers are also commonly used by persons of ordinary skill in the art and may be used in carrying out the method of the present invention.

Figure 6:
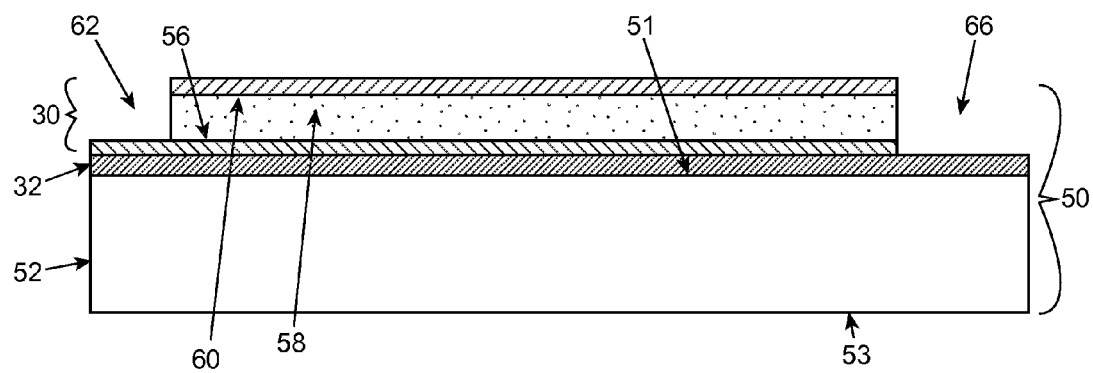
FIG. 6 is a side view of the layered material stack of FIG. 5, in which the first metal layer is patterned to remove a portion thereof from the layered material stack.

Next as shown in FIG. 6, according to one embodiment, patterning first piezoelectric stack layer 30 involves patterning first metal layer 56 to remove a portion thereof (e.g., portion 66) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 7:
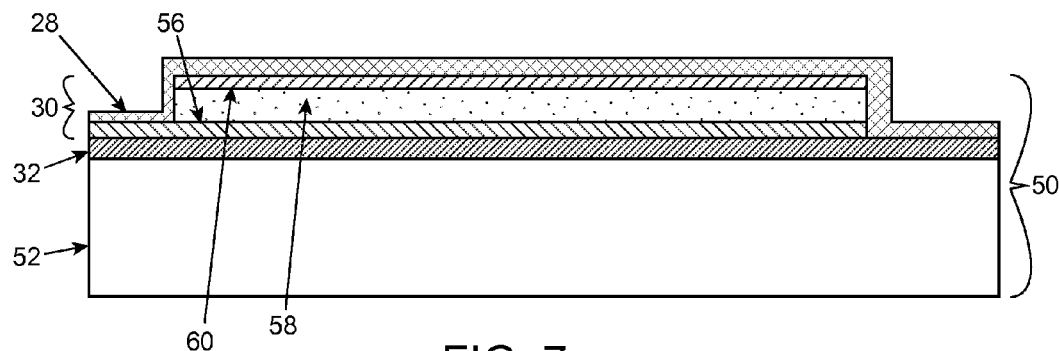
FIG. 7 is a side view of the layered material stack of FIG. 6, in which a second silicon dioxide layer has been deposited over the patterned piezoelectric stack layer and the first silicon dioxide layer.

Next, as shown in FIG. 7, a second silicon dioxide layer 28 is deposited over the patterned first piezoelectric stack layer 30 and the first silicon dioxide layer 32. Second silicon dioxide layer 28 is, according to one embodiment, a high temperature oxide layer. This layer provides electrical isolation of the first piezoelectric stack layer 30. According to one embodiment, this step is carried out using plasma-enhanced chemical vapor deposition of silane (a silicon source) to deposit silicon for the passivation layer. This layer may be deposited to a thickness of about 1 µm.

Figure 8:
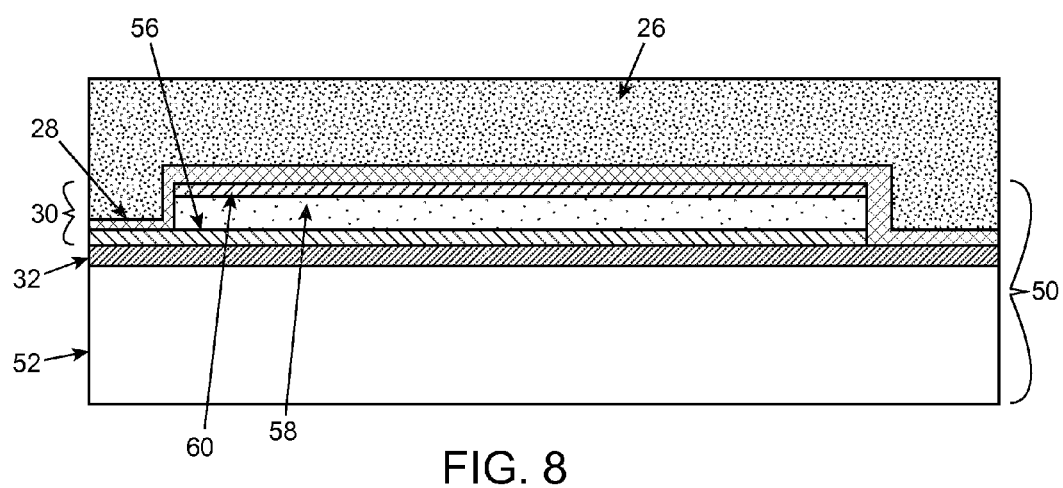
FIG. 8 is a side view of the layered material stack of FIG. 7, in which a cantilever material layer has been deposited over the second silicon dioxide layer.

In the next method step illustrated in FIG. 8, cantilever material 26 is deposited over the deposited second silicon dioxide layer 28. Cantilever material 26 may be any suitable material such as silicon, polySi, metal (e.g., Cu or Ni), or other metal oxide semiconductor (CMOS) compatible material, or a high temperature polymer such as polyimide. In one embodiment, cantilever material 26 is deposited on second silicon dioxide layer 28 by chemical vapor deposition at a thickness range of about 10 µm to about 200 µm, about 10 µm to about 75 µm, or about 10 µm to about 50 µm. Following deposition, it may be desirable to smooth the surface of cantilever material 26, e.g., by chemical mechanical polish.

Figure 9:
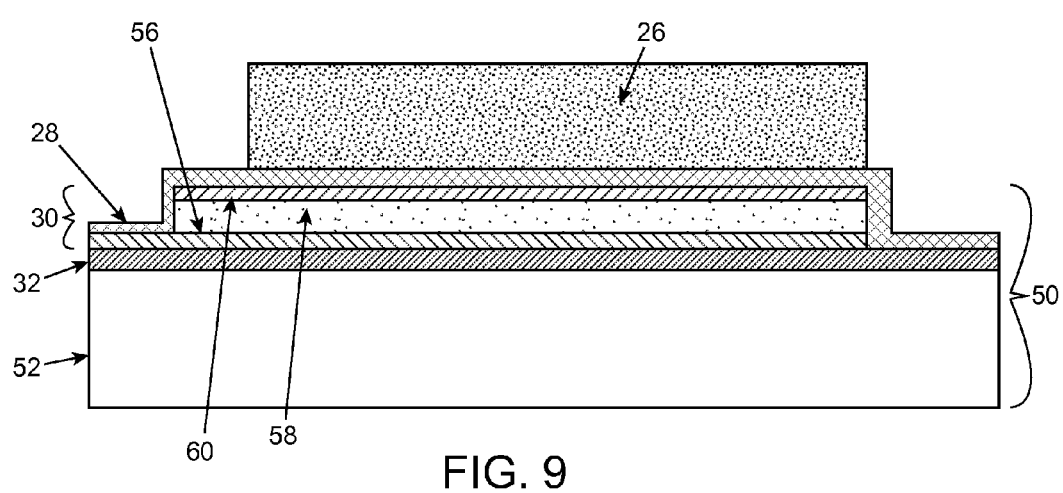
FIG. 9 is a side view of the layered material stack of FIG. 8, in which, according to one embodiment of the present invention, the cantilevered material layer has been patterned to remove a portion thereof from the layered material stack.

Next, the cantilever material 26 is patterned. This method step is illustrated in FIG. 9. According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used.

Figure 10:
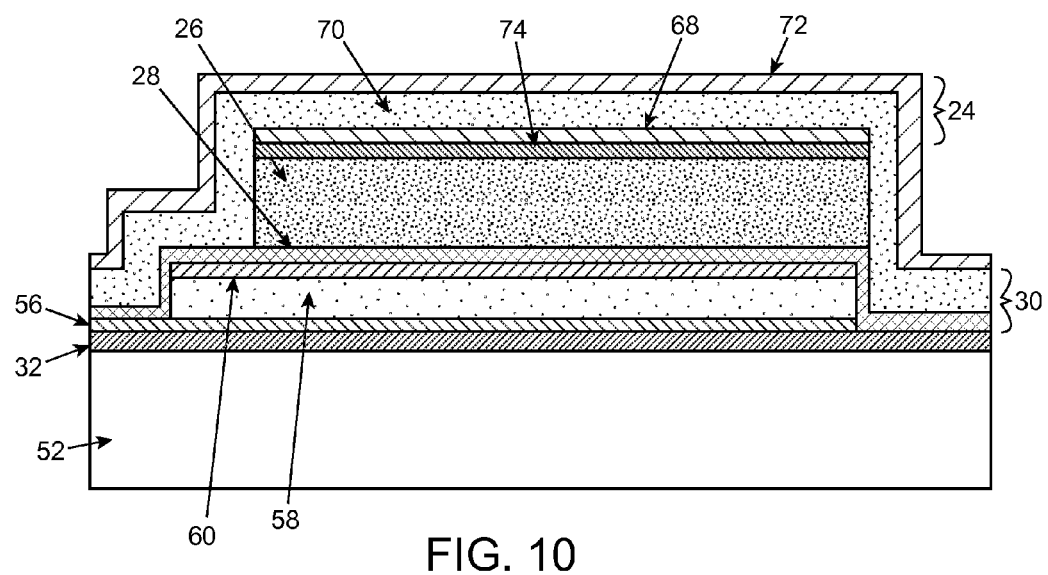
FIG. 10 is a side view of the layered material stack of FIG. 9, in which a second piezoelectric stack layer including a piezoelectric material layer and a metal layer has been deposited over the patterned cantilever material layer and the second silicon dioxide layer.

FIG. 10 illustrates the next method step which involves depositing second piezoelectric stack layer 24 over the cantilever layer 26 to form a second metal/piezoelectric material/metal layer. According to one embodiment, second piezoelectric stack layer 24 has a thickness of about 0.5 µm to about 6 µm or about 2 µm to about 5 µm in thickness. According to one embodiment, second piezoelectric stack layer 24 includes optional first metal layer 68, piezoelectric material layer 70, and second metal layer 72. In another embodiment, second piezoelectric stack layer 24 includes second metal layer 72 over the piezoelectric material layer 70 which is on the patterned cantilever material 26. In this configuration, the cantilever material 26 is useful as an electrode.

First metal layer 68 (when present) and second metal layer 72 may be formed of any suitable metals that adequately function as an electrode. According to one embodiment, these layers are formed of the same material, such as molybdenum or platinum. However, both layers need not be formed of the same material. Piezoelectric material layer 70 is formed of any suitable piezoelectric material, as discussed above. According to one embodiment, this layer is formed of aluminum nitride (AlN).

Deposition of second piezoelectric stack layer 24 may be carried out with thin adhesion layer 74 underneath as is standard in the art. Suitable adhesion layers 74 may include materials such as titanium, AlN, Al:Cu, or Al at a layer thickness of about 0.02 µm to about 0.05 µm.

Figure 11:
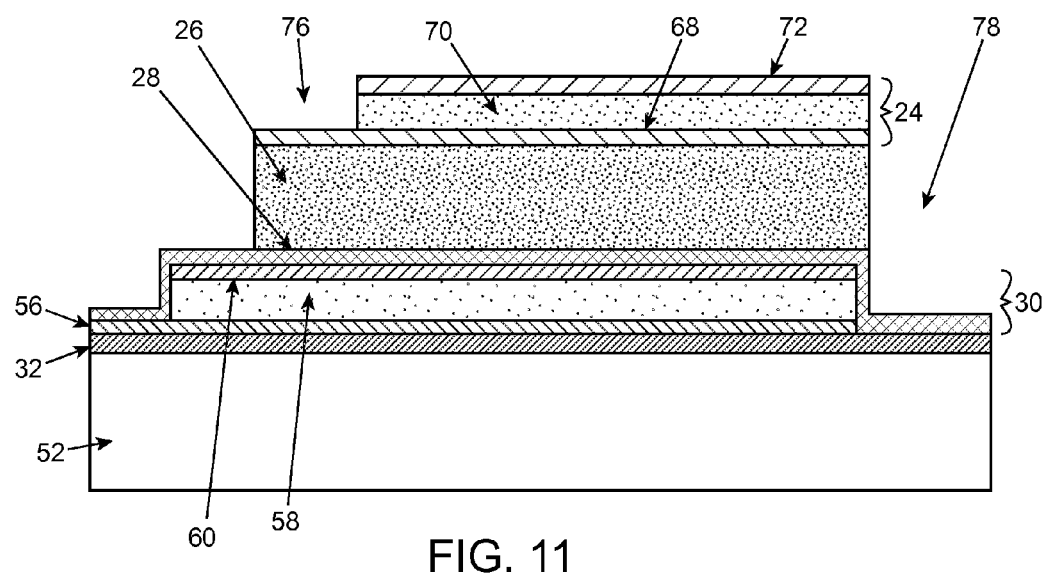
FIG. 11 is a side view of the layered material stack of FIG. 10, in which the second piezoelectric stack layer has been patterned to remove a portion of the second piezoelectric stack layer from the layered material stack.

Next, as shown in FIG. 11, second piezoelectric stack layer 24 is patterned. In particular, portions (e.g., portions 76 and 78) of piezoelectric material layer 70 and second metal layer 72 are removed from the second piezoelectric stack layer 24 to expose first metal layer 68 (if present) or cantilever material layer 26.

Patterning second piezoelectric stack layer 24 according to the method of the present invention may be accomplished using lithography techniques combined with wet etch with phosphoric acid for the metal layers and tetramethylamoniumhydroxide. Other suitable chemistries for wet or dry etching of the layers are also commonly used by persons of ordinary skill in the art and may be used in carrying out the method of the present invention.

According to one embodiment, the method of the present invention may further involve applying a passivation layer to the second patterned piezoelectric stack layer, the patterned cantilever material, and the first patterned piezoelectric stack layer and patterning the passivation layer, prior to etching the second side surface of the silicon wafer. According to another embodiment, the method of the present invention may further involve depositing a metal bondpad layer on the patterned passivation layer prior to etching the second side surface of the silicon wafer.

Figure 12:
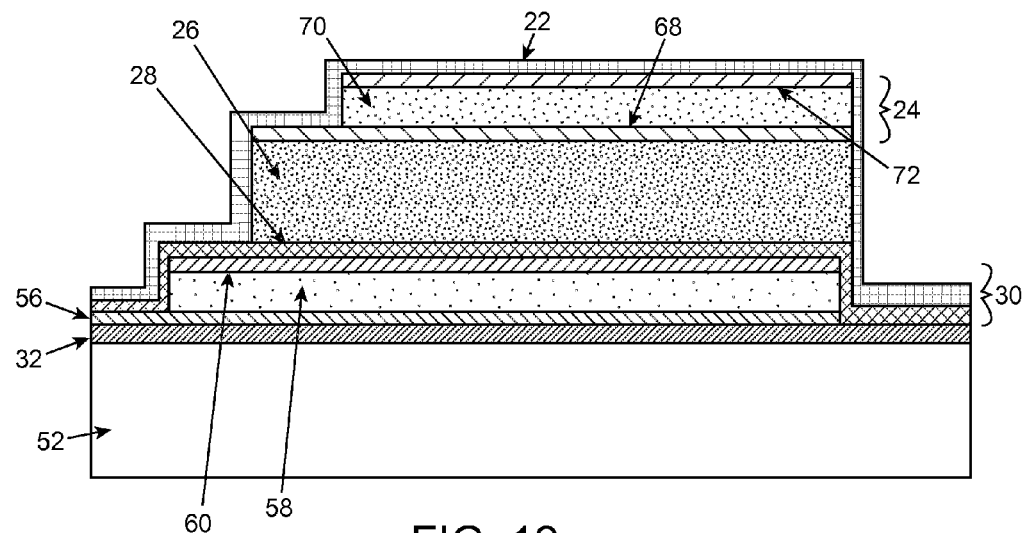
FIG. 12 is a side view of the layered material stack of FIG. 11, in which a third silicon dioxide layer has been deposited over the patterned second piezoelectric stack layer, the patterned cantilever material layer, and the second silicon dioxide layer.

In the next method step, as shown in FIG. 12, a third silicon dioxide layer 22 is deposited over the patterned second piezoelectric stack layer 24, the patterned cantilever material layer 26, and the second silicon dioxide layer 28. According to one embodiment, this step is carried out using plasma-enhanced chemical vapor deposition of silane (a silicon source) to deposit silicon for the passivation layer. This layer may be deposited to a thickness of about 1 µm. According to another embodiment, depositing the third silicon dioxide layer is an optional step that provides robustness to the structure against abrasion.

Figure 13:
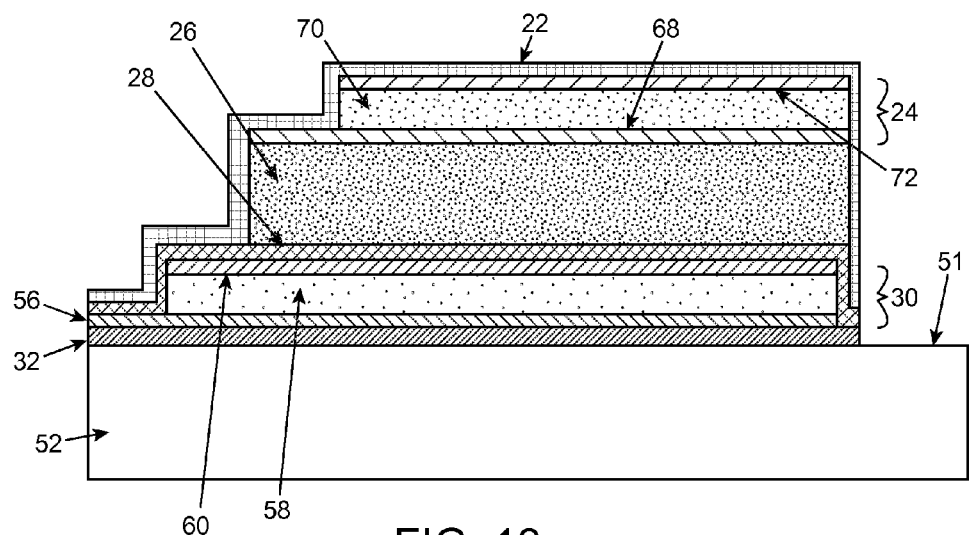
FIG. 13 is a side view of the layered material stack of FIG. 12 which has been patterned to remove portions of the third silicon dioxide layer, the second silicon dioxide layer, and the first silicon dioxide layer.

In the method step shown in FIG. 13, first, second, and third silicon dioxide layers 32, 28, and 22 are patterned so that the cantilever will be released after backside etch. According to one embodiment, this step involves removing a portion of the first, second, and third silicon dioxide layers 32, 28, and 22 to expose the first surface 51 of the silicon wafer 52. According to one embodiment, this patterning is carried out using the $CHF_3$ reactive ion etch process.

Figure 14:
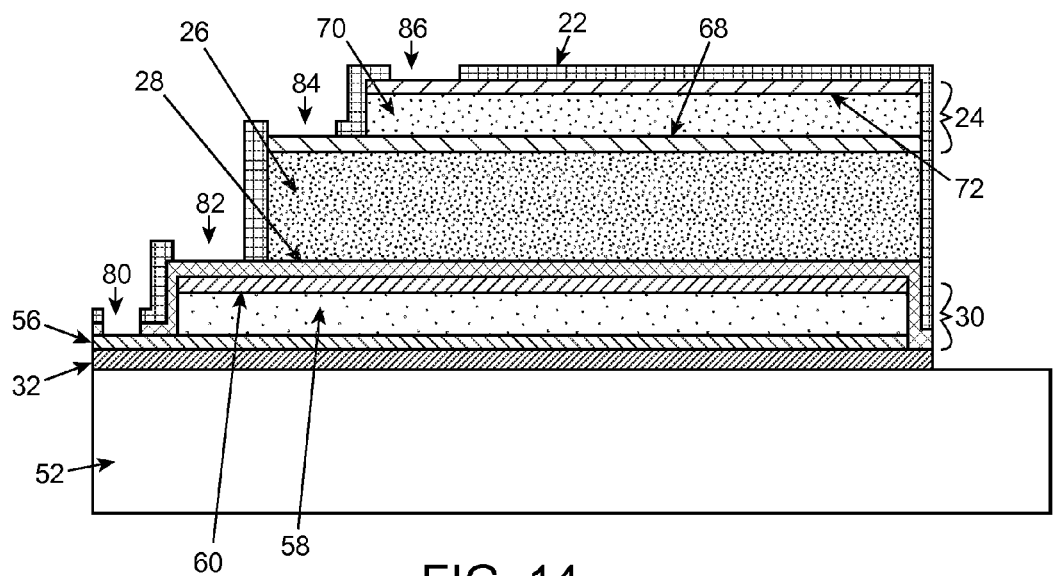
FIG. 14 is a side view of the layered material stack of FIG. 13 which has been patterned to remove a portion of the third silicon dioxide layer to leave a portion of the second piezoelectric stack layer, a portion of the cantilever material layer, a portion of the first piezoelectric stack layer, and a portion of the first silicon dioxide layer exposed.

Next, as shown in FIG. 14, third silicon dioxide layer 22 is patterned. According to one embodiment, this step involves removing a portion of third silicon dioxide layer 22 to leave portions 80 and 82 of first piezoelectric stack layer 30, and portions 84 and 86 of second piezoelectric layer 24, exposed. According to one embodiment, this patterning is carried out using the $CHF_3$ reactive ion etch process.

Figure 15:
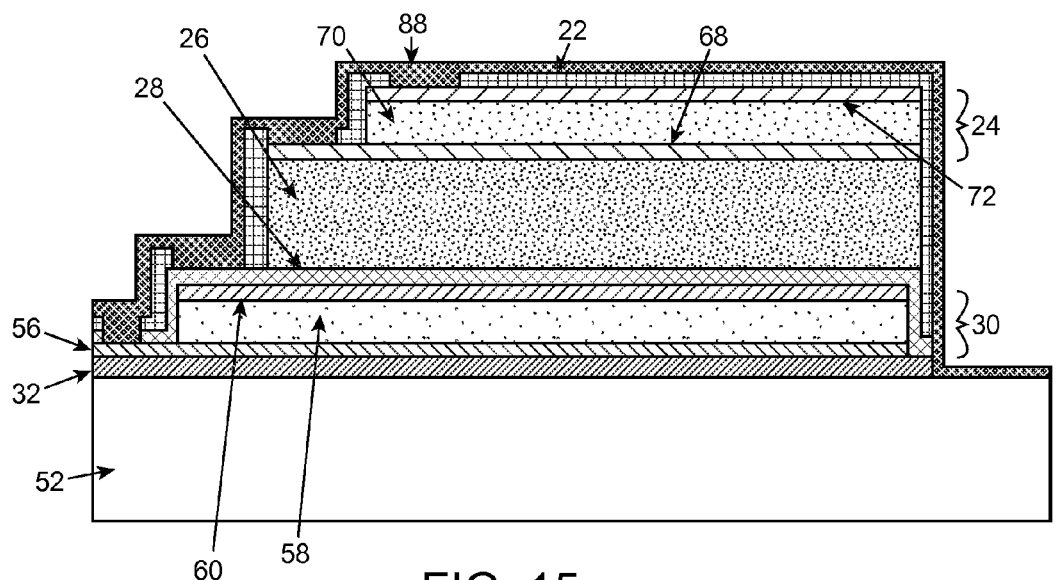
FIG. 15 is a side view of the layered material stack of FIG. 14, in which a metal bondpad layer has been deposited over the patterned third silicon dioxide layer, and portions of the patterned second piezoelectric stack layer, the patterned cantilever layer, and the patterned first piezoelectric stack layer.

A further (optional) method step is illustrated in FIG. 15, which illustrates metal bondpad layer 88 deposited over the patterned third silicon dioxide layer 22, as well as portions 80 and 82 of first piezoelectric stack layer 30, and portion 84 and 86 of second piezoelectric stack layer 24. Bondpad layer 88 provides a surface that allows for a robust wire bond to be formed to the device, ensuring good electrical connection. According to one embodiment, metal bondpad layer 88 is deposited to a thickness of about 1 μm, and is a metal material (e.g., Al). This layer is deposited to improve reliability of the wire bond.

Figure 16:
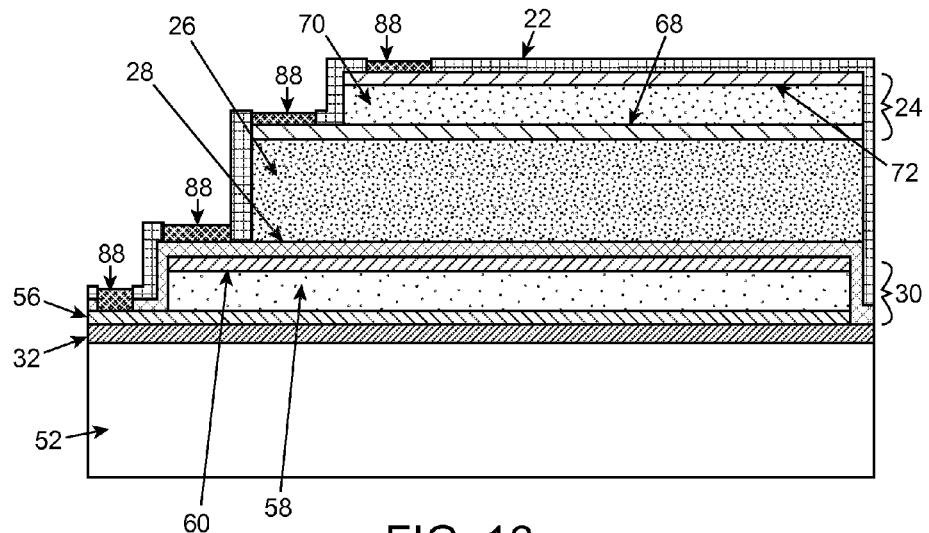
FIG. 16 is a side view of the layered material stack of FIG. 15 which has been patterned to remove portions of the metal bondpad layer.

FIG. 16 illustrates the next method step which involves patterning metal bondpad layer 88 when present. According to one embodiment, metal bondpad layer 88 is patterned slightly longer than openings for top and bottom electrode connections. In one embodiment, patterning of metal bondpad layer 88 is carried out using wet etch chemistry based on phosphoric acid. However, other methods may also be used.

Figure 17:
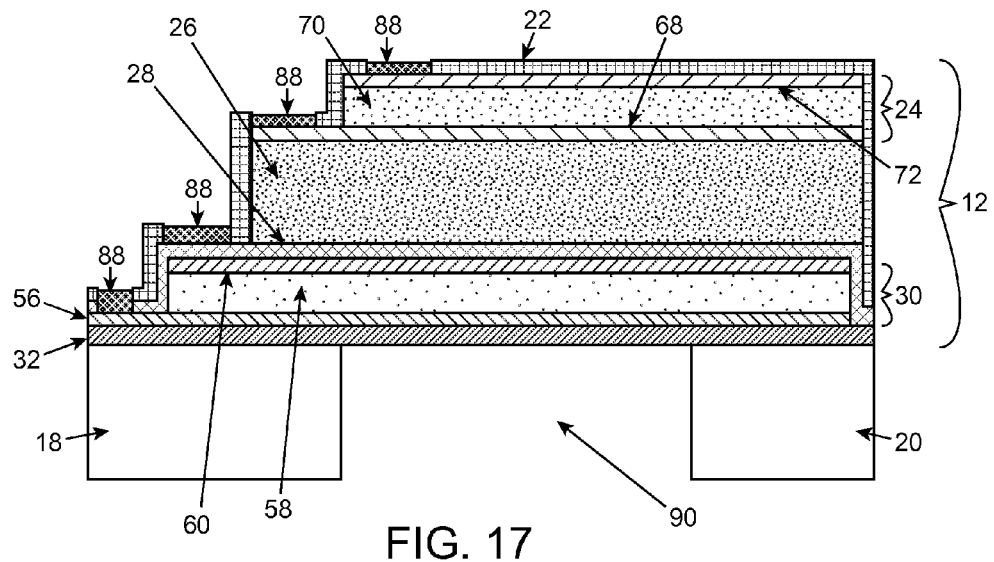
FIG. 17 is a side view of the layered material stack of FIG. 16, in which portions of the of the silicon wafer have been etched to create a resonator beam, a base, and a mass, thus creating one embodiment of the energy harvester device of the present invention, which has dual piezoelectric stacks.

The next method step is illustrated in FIG. 17, where silicon wafer 52 is etched at surface 53 to create resonator beam 12, base 18, and mass 20, thus producing one embodiment of the energy harvesting device of the present invention. In other words, portions of silicon wafer 52 are etched away to create a cavity 90 beneath what has become resonator beam 12 to create the separation between the portion of silicon wafer 52 that has become base 18 and portion of silicon wafer 52 that has become mass 20. According to one embodiment, etching silicon wafer 52 is carried out using lithography techniques and deep reactive ion etch with $SF_6/C_4F_8$ chemistry.

A further aspect of the present invention relates to a method of producing an energy harvester device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A cantilever material is deposited over the deposited second silicon dioxide layer. A third silicon dioxide layer is deposited over the deposited cantilever material. A second piezoelectric stack layer is deposited over the cantilever material and patterned. The third silicon dioxide layer and the cantilever material are patterned. The second side surface of the silicon wafer is etched to produce the energy harvesting device.

Figure 18:
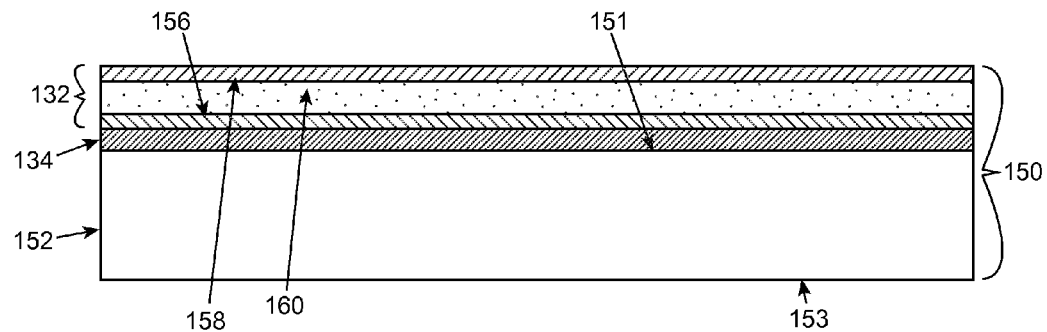
FIG. 18 is a side view of a layered material stack for producing a second embodiment of an energy harvester device of the present invention. The layered material stack includes a silicon wafer, a first silicon dioxide layer, an optional adhesion layer, and a first piezoelectric stack layer including a first metal layer, a piezoelectric material layer, and a second metal layer.

As illustrated in FIG. 18, another embodiment of the method of forming the energy harvester device of the present invention involves forming layered material stack 150 by providing silicon wafer 152 (as described above) having first surface 151 and second surface 153, depositing first silicon dioxide layer 134 (it is to be understood that the numerical designations of the layers relate to the embodiment of the energy harvester of the present invention shown in FIG. 2) on first surface 151 of silicon wafer 152, depositing optional adhesion layer 154 on first silicon dioxide layer 134, and depositing first piezoelectric stack layer 132 on first silicon dioxide layer 134.

First silicon dioxide layer 134 is, according to one embodiment, a thermal oxide layer. In one embodiment, first silicon dioxide layer 134 has a thickness of about 0.25 μm to about 2 μm. Deposition of first silicon dioxide layer 134 onto first surface 51 of silicon wafer 52 can be carried out by methods known in the art. For example, silicon dioxide may be thermally grown and then deposited on the silicon wafer. In one particular example, one (1) μm (+/−0.05 μm) of thermally grown $SiO_2$ is deposited onto silicon wafer 52 to form silicon dioxide layer 134.

First piezoelectric stack layer 132 is deposited onto first silicon dioxide layer 134 to form a metal/piezoelectric material/metal layer. According to one embodiment, piezoelectric stack layer 134 has a thickness of about 0.5 μm to about 6 μm, or about 2 μm to about 5 μm in thickness. First piezoelectric stack layer 132 includes first metal layer 156, second metal layer 158, and piezoelectric layer 160. First metal layer 156 and second metal layer 158 may be formed of any suitable metals that adequately function as an electrode. According to one embodiment, these layers are formed of the same material, such as molybdenum or platinum. However, both layers need not be formed of the same material. Piezoelectric material layer 160 is formed of any suitable piezoelectric material, as discussed above. According to one embodiment, this layer is formed of aluminum nitride (AlN).

Deposition of first piezoelectric stack layer 132 may be carried out with thin adhesion layer 154 underneath as is standard in the art. Suitable adhesion layers 154 may include materials such as titanium, AlN, Al:Cu, or Al at a layer thickness of about 0.02 μm to about 0.05 μm.

Figure 19:
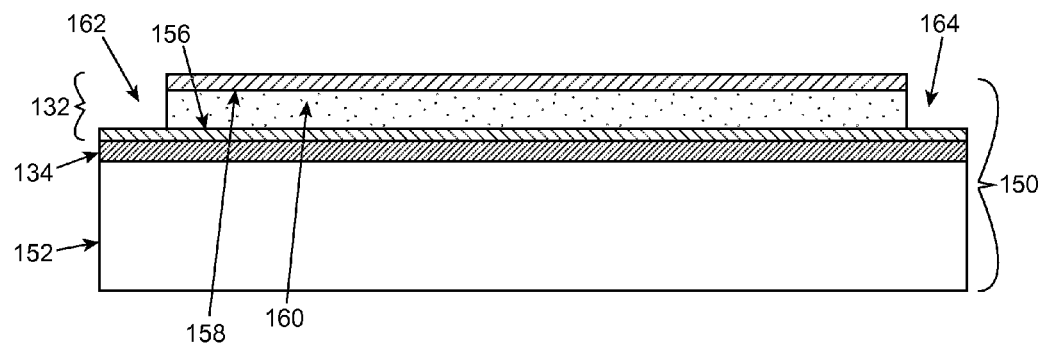
FIG. 19 is a side view of the layered material stack of FIG. 18 which has been patterned, according to one embodiment of the method of producing an energy harvester device of the present invention, to remove portions of the piezoelectric material layer and metal layer(s) from the stack.

One embodiment of the method of making an energy harvester device of the present invention proceeds as illustrated in FIGS. 19-33. First, as shown in FIG. 19, piezoelectric stack layer 132 is patterned. In particular, portions (e.g., portions 162 and 164) of piezoelectric material layer 160 and second metal layer 158 are removed from stack 50 to expose first metal layer 156. Patterning first piezoelectric stack layer 132 according to the method of the present invention may be accomplished using lithography techniques combined with wet etch with phosphoric acid for the metal layers and tetramethylamoniumhydroxide. Other suitable chemistries for wet or dry etching of the layers are also commonly used by persons of ordinary skill in the art and may be used in carrying out the method of the present invention.

Figure 20:
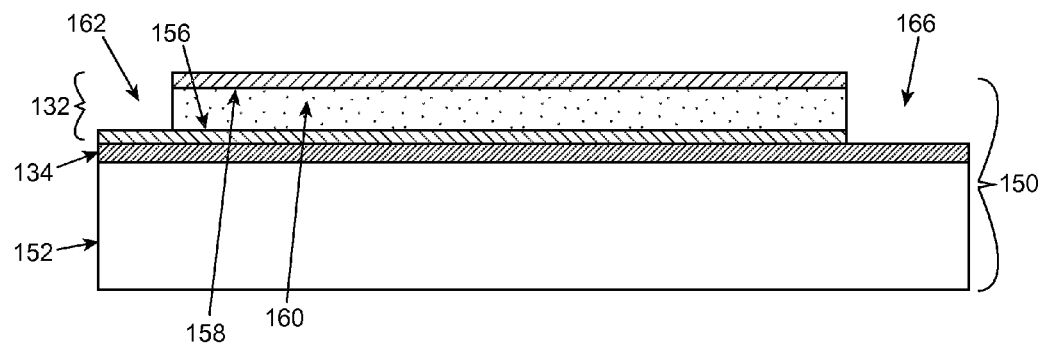
FIG. 20 is a side view of the layered material stack of FIG. 19, in which the first metal layer is patterned to remove a portion thereof from the layered material stack.

Next, as shown in FIG. 20, according to one embodiment, patterning first piezoelectric stack layer 132 involves patterning first metal layer 156 to remove a portion thereof (e.g., portion 166) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 21:
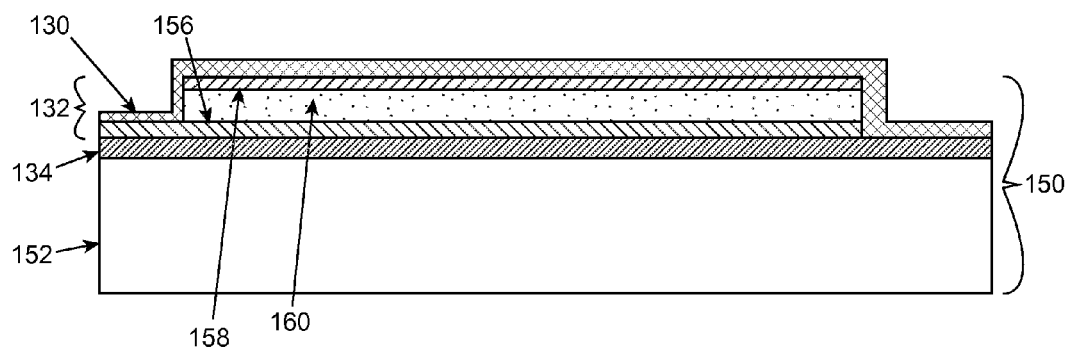
FIG. 21 is a side view of the layered material stack of FIG. 20, in which a second silicon dioxide layer has been deposited over the patterned piezoelectric stack layer and the first silicon dioxide layer.

Next, as shown in FIG. 21, a second silicon dioxide layer 130 is deposited over the patterned first piezoelectric stack layer 132 and the first silicon dioxide layer 134. Second silicon dioxide layer 130 is, according to one embodiment, a high temperature oxide layer. This layer provides electrical isolation of the first piezoelectric stack layer 132. According to one embodiment, this step is carried out using plasma-enhanced chemical vapor deposition of silane (a silicon source) to deposit silicon for the passivation layer. This layer may be deposited to a thickness of about 1 μm.

Figure 22:
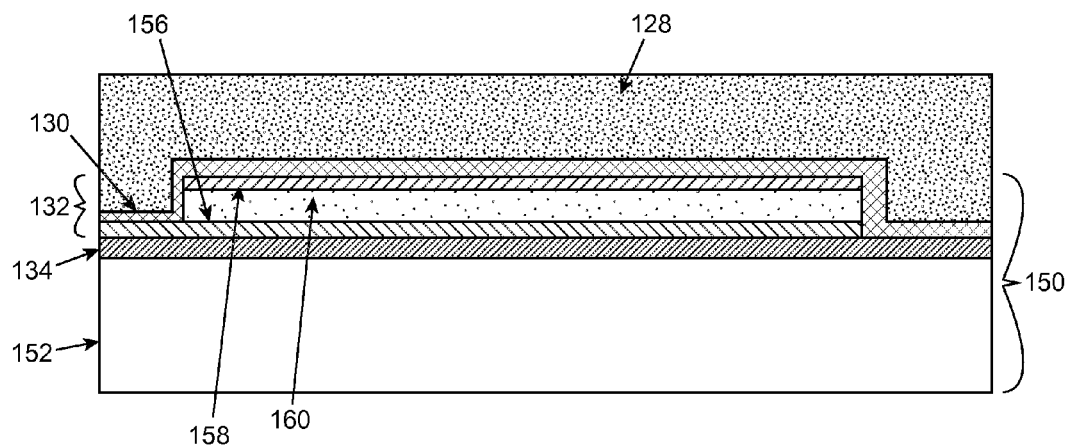
FIG. 22 is a side view of the layered material stack of FIG. 21, in which a cantilever material layer has been deposited over the second silicon dioxide layer.

In the next method step illustrated in FIG. 22, cantilever material 128 is deposited over the deposited second silicon dioxide layer 130. Cantilever material 128 may be any suitable material such as silicon, polySi, metal (e.g., Cu or Ni), or other metal oxide semiconductor (CMOS) compatible material, or a high temperature polymer such as polyimide. In one embodiment, cantilever material 128 is deposited on second silicon dioxide layer 130 by chemical vapor deposition at a thickness range of about 10 μm to about 200 μm, about 10 μm to about 75 μm, or about 10 μm to about 50 μm. Following deposition, it may be desirable to smooth the surface of cantilever material 128, e.g., by chemical mechanical polish.

Figure 23:
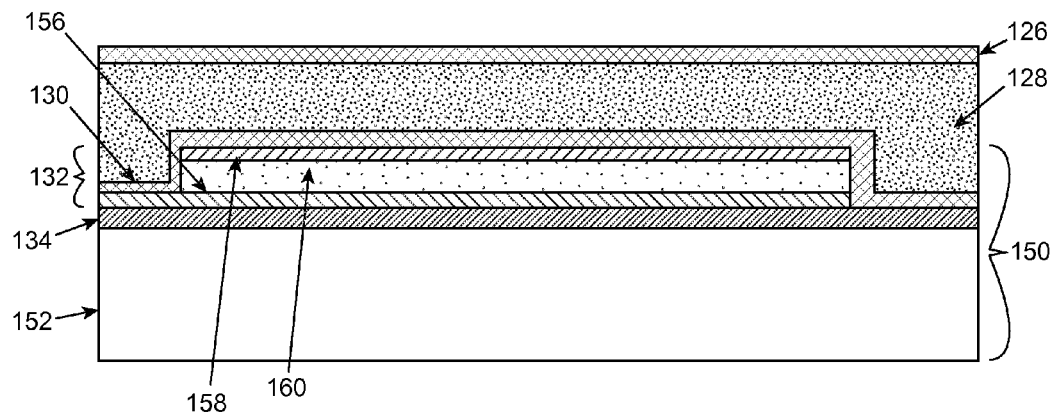
FIG. 23 is a side view of the layered material stack of FIG. 22, in which a third silicon dioxide layer has been deposited over the cantilever material layer.

Next, as shown in FIG. 23, third silicon dioxide layer 126 is deposited over cantilever layer 128. Third silicon dioxide layer 126 is, according to one embodiment, a high temperature oxide layer. According to one embodiment, this step is carried out using plasma-enhanced chemical vapor deposition of silane (a silicon source) to deposit silicon for the passivation layer. This layer may be deposited to a thickness of about 1 μm.

Figure 24:
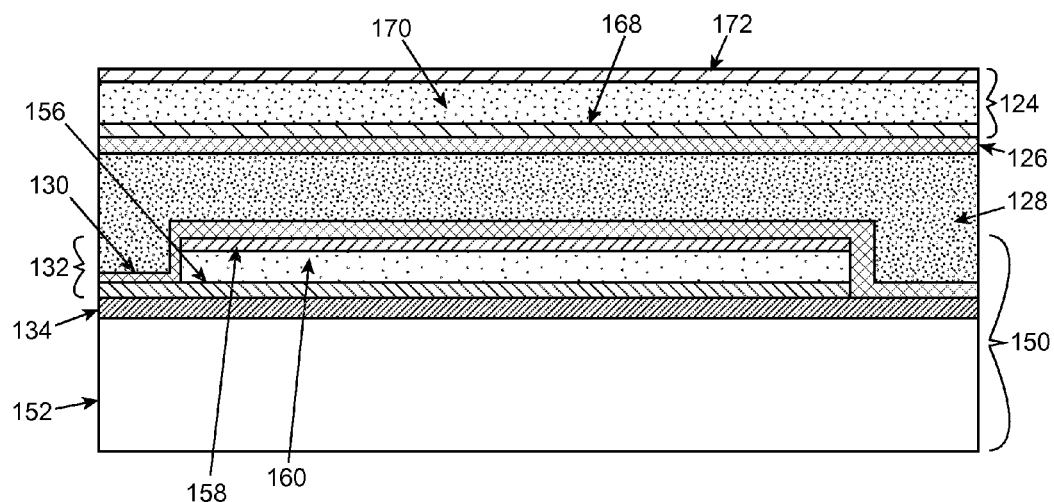
FIG. 24 is a side view of the layered material stack of FIG. 23, in which a second piezoelectric stack layer, including a first metal layer, a piezoelectric material layer, and a second metal layer, has been deposited over the cantilever material layer and the second silicon dioxide layer.

FIG. 24 illustrates the next method step, which involves depositing second piezoelectric stack layer 124 over third silicon dioxide layer 126 to form a second metal/piezoelectric material/metal layer. According to one embodiment, second piezoelectric stack layer 124 has a thickness of about 0.5 μm to about 6 μm, or about 2 μm to about 5 μm in thickness. According to one embodiment, second piezoelectric stack layer 124 includes first metal layer 168, piezoelectric material layer 170, and second metal layer 172.

First metal layer 168 and second metal layer 172 may be formed of any suitable metals that adequately function as an electrode. According to one embodiment, these layers are formed of the same material, such as molybdenum or platinum. However, both layers need not be formed of the same material. Piezoelectric material layer 170 is formed of any suitable piezoelectric material, as discussed above. According to one embodiment, this layer is formed of aluminum nitride (AlN).

Deposition of second piezoelectric stack layer 124 may be carried out with thin adhesion layer 174 underneath as is standard in the art. Suitable adhesion layers 174 may include materials such as titanium, AlN, Al:Cu, or Al at a layer thickness of about 0.02 μm to about 0.05 μm.

Figure 25:
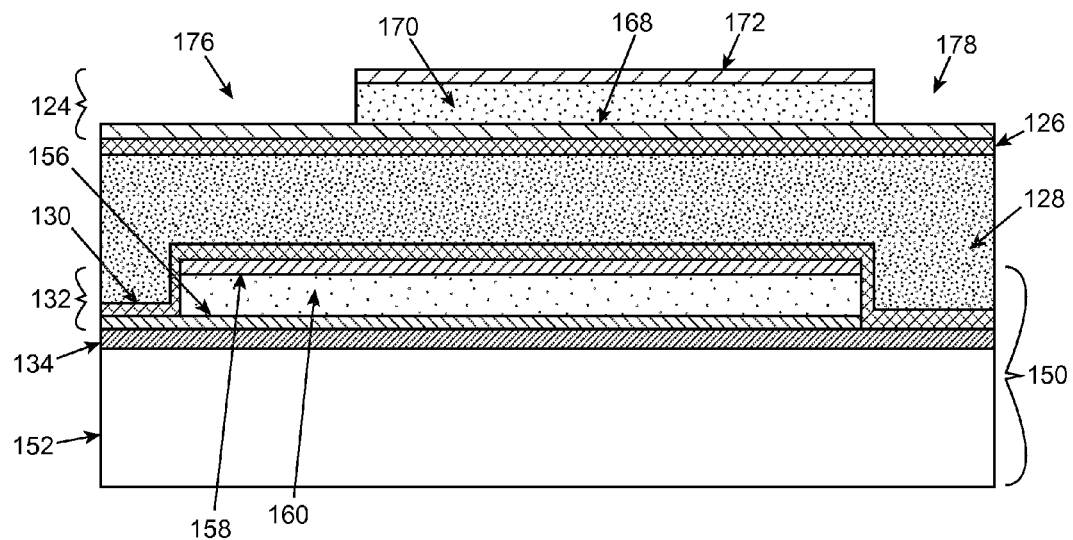
FIG. 25 is a side view of the layered material stack of FIG. 24, in which the second piezoelectric stack layer has been patterned to remove portions of the piezoelectric material layer and metal layer(s) from the second piezoelectric stack layer.

Next, as shown in FIG. 25, second piezoelectric stack layer 124 is patterned. In particular, portions (e.g., portions 176 and 178) of piezoelectric material layer 170 and second metal layer 172 are removed from the second piezoelectric stack layer 124 to expose first metal layer 168. Patterning second piezoelectric stack layer 124 according to the method of the present invention may be accomplished using lithography techniques combined with wet etch with phosphoric acid for the metal layers and tetramethylamoniumhydroxide. Other suitable chemistries for wet or dry etching of the layers are also commonly used by persons of ordinary skill in the art and may be used in carrying out the method of the present invention.

Figure 26:
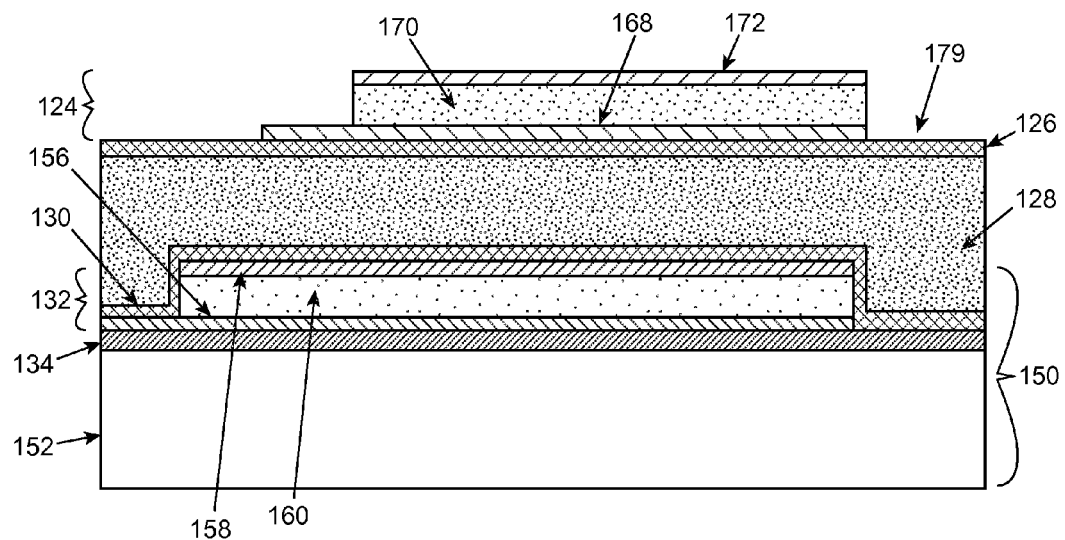
FIG. 26 is a side view of the layered material stack of FIG. 25, in which the first metal layer is patterned to remove a portion thereof from the second piezoelectric stack layer of the layered material stack.

Next, as shown in FIG. 26, according to one embodiment, patterning second piezoelectric stack layer 124 involves patterning first metal layer 168 to remove a portion thereof (e.g., portion 179) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 27:
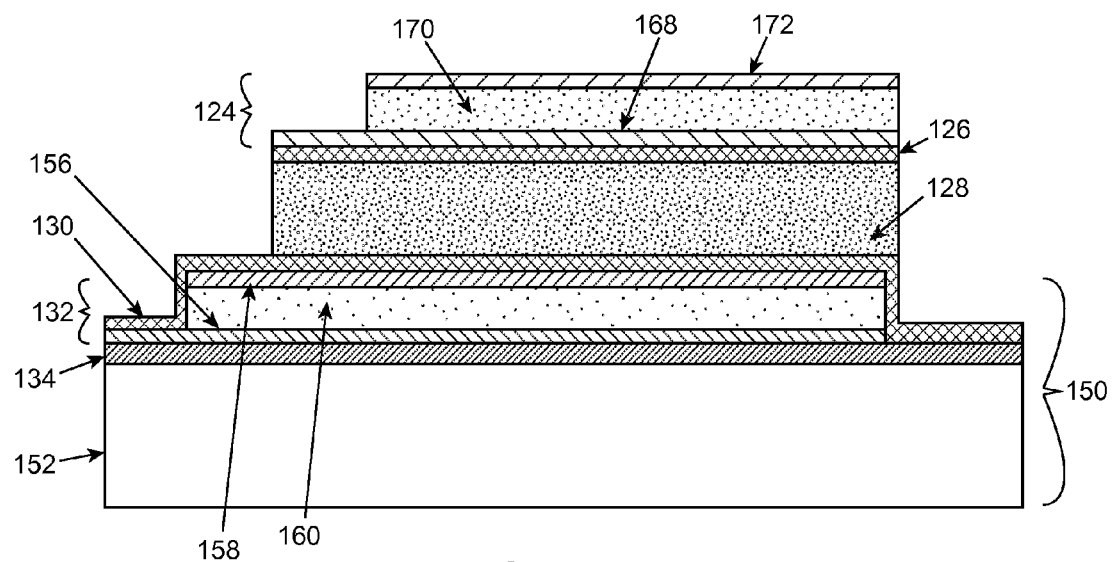
FIG. 27 is a side view of the layered material stack of FIG. 26, in which the third silicon dioxide layer and the cantilevered material layer have been patterned to remove portions thereof from the layered material stack.

Next, the cantilever material 128 and third silicon dioxide layer 126 are patterned. This method step is illustrated in FIG. 27. According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used.

According to one embodiment, the method of the present invention may further involve applying a passivation layer to the second patterned piezoelectric stack layer, the patterned cantilever material, and the first patterned piezoelectric stack layer and patterning the passivation layer, prior to etching the second side surface of the silicon wafer. According to another embodiment, the method of the present invention may further involve depositing a metal bondpad layer on the patterned passivation layer prior to etching the second side surface of the silicon wafer.

Figure 28:
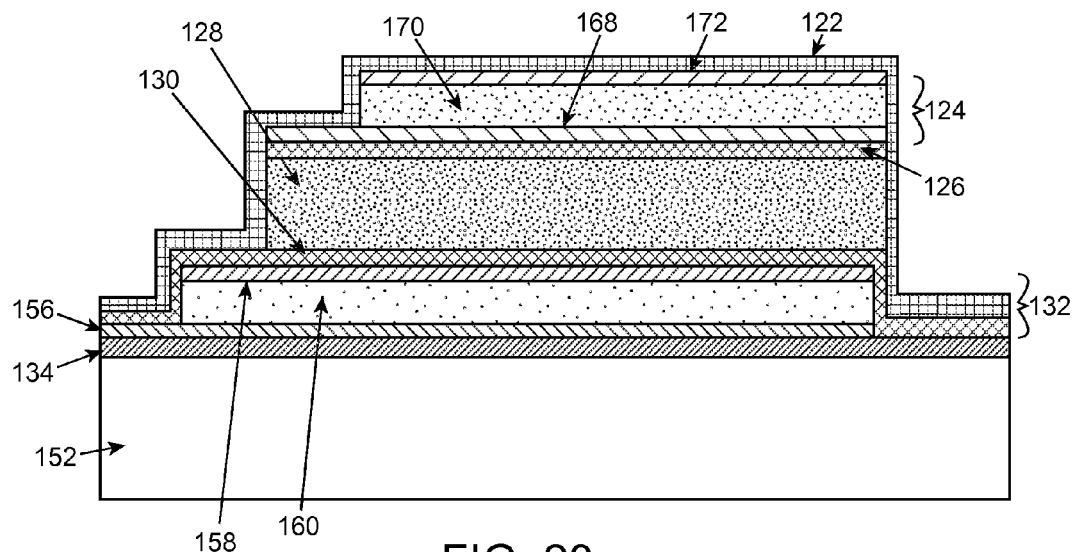
FIG. 28 is a side view of the layered material stack of FIG. 27, in which a fourth silicon dioxide layer has been deposited over the patterned second piezoelectric stack layer and the second silicon dioxide layer.

In the next method step, as shown in FIG. 28, a fourth silicon dioxide layer 122 is deposited over the patterned second piezoelectric stack layer 124 and the second silicon dioxide layer 130. According to one embodiment, this step is carried out using plasma-enhanced chemical vapor deposition of silane (a silicon source) to deposit silicon for the passivation layer. This layer may be deposited to a thickness of about 1 μm. According to another embodiment, depositing the third silicon dioxide layer is an optional step that provides robustness to the structure against abrasion.

Figure 29:
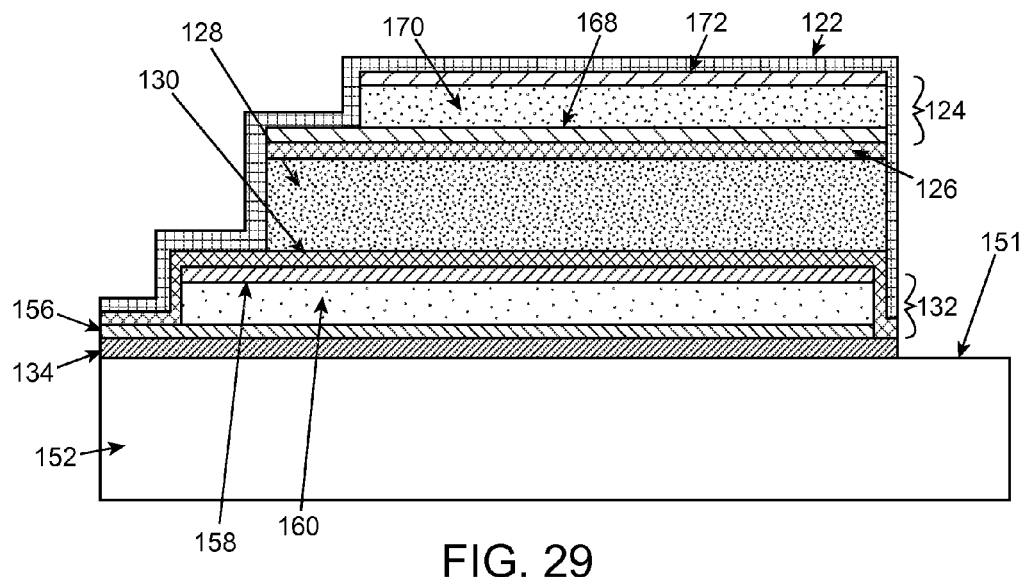
FIG. 29 is a side view of the layered material stack of FIG. 28 which has been patterned to remove portions of the fourth silicon dioxide layer, the third silicon dioxide layer, the second silicon dioxide layer, and the first silicon dioxide layer.

In the method step shown in FIG. 29, first, second, and fourth silicon dioxide layers 134, 130, and 122 are patterned so that the cantilever will be released after backside etch. According to one embodiment, this step involves removing a portion of the first, second, and fourth silicon dioxide layers 134, 130, and 122 to expose the first surface 151 of the silicon wafer 152. According to one embodiment, this patterning is carried out using the $CHF_3$ reactive ion etch process.

Figure 30:
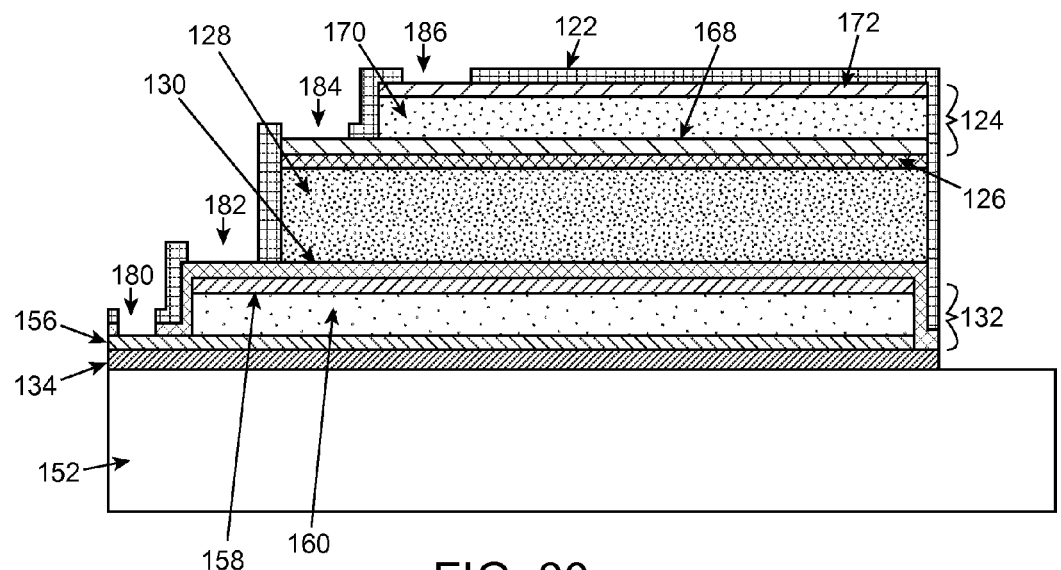
FIG. 30 is a side view of the layered material stack of FIG. 29 which has been patterned to remove a portion of the fourth silicon dioxide layer to leave a portion of the second piezoelectric stack layer, a portion of the second silicon dioxide layer, and a portion of the first piezoelectric stack layer exposed.

Next, as shown in FIG. 30, fourth silicon dioxide layer 122 is patterned. According to one embodiment, this step involves removing a portion of fourth silicon dioxide layer 122 to leave portions 180 and 182 of first piezoelectric stack layer 132 and portions 184 and 186 of second piezoelectric layer 124 exposed. According to one embodiment, this patterning is carried out using the $CHF_3$ reactive ion etch process.

Figure 31:
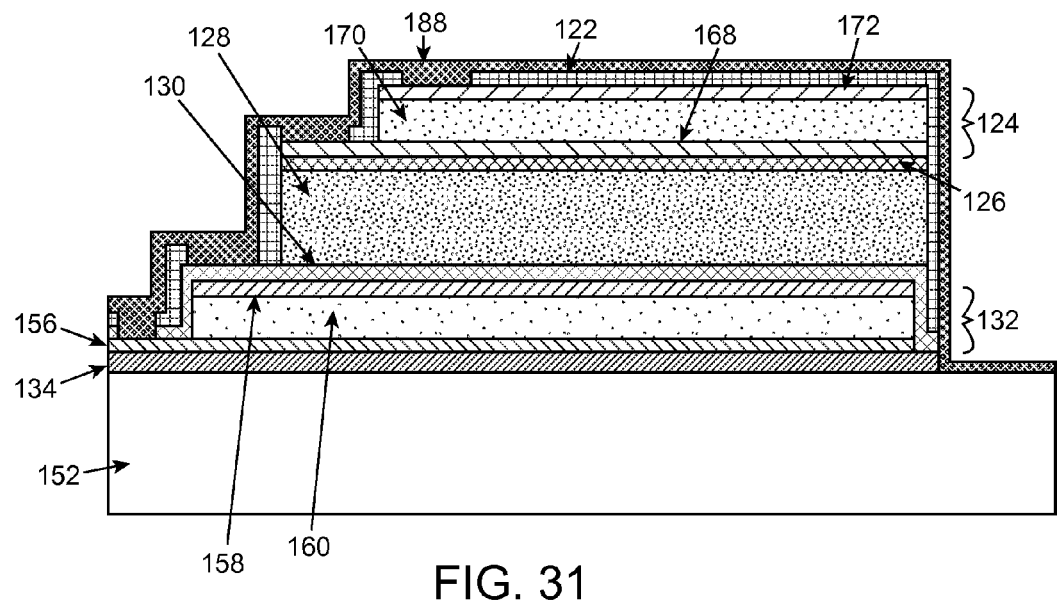
FIG. 31 is a side view of the layered material stack of FIG. 30, in which a metal bondpad layer has been deposited over the patterned fourth silicon dioxide layer and portions of the patterned second piezoelectric stack layer, the patterned second silicon dioxide layer, and the patterned first piezoelectric stack layer.

A further (optional) method step is illustrated in FIG. 31, which illustrates metal bondpad layer 188 deposited over the patterned fourth silicon dioxide layer 122, as well as portions 180 and 182 of first piezoelectric stack layer 132, and portion 184 and 186 of second piezoelectric stack layer 124. Bondpad layer 188 provides a surface that allows for a robust wire bond to be formed to the device, ensuring good electrical connection. According to one embodiment, metal bondpad layer 188 is deposited to a thickness of about 1 μm, and is a metal material (e.g., Al). This layer is deposited to improve reliability of the wire bond.

Figure 32:
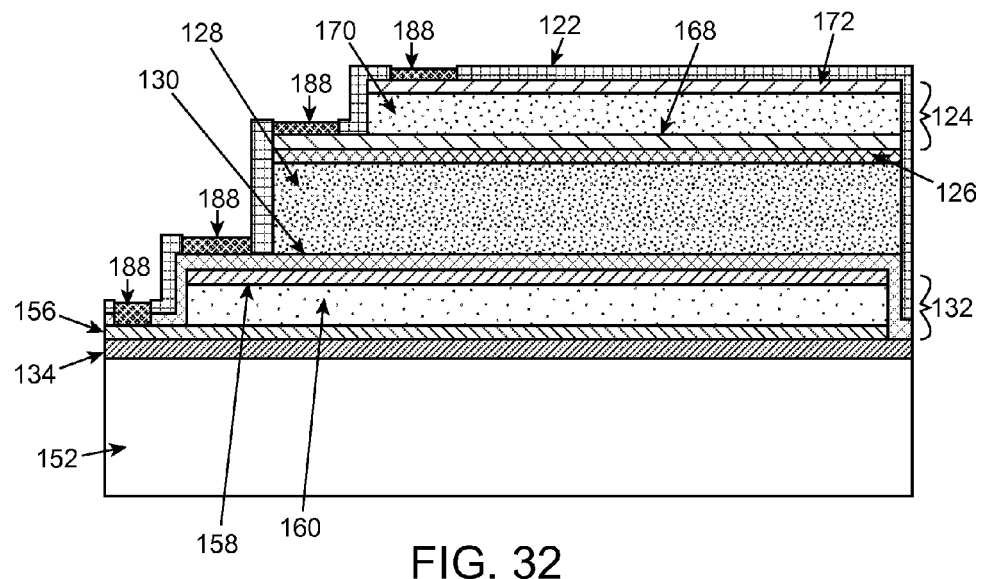
FIG. 32 is a side view of the layered material stack of FIG. 31 which has been patterned to remove portions of the metal bondpad layer.

FIG. 32 illustrates the next method step, which involves patterning metal bondpad layer 188 when present. According to one embodiment, metal bondpad layer 188 is patterned slightly longer than openings for top and bottom electrode connections. In one embodiment, patterning of metal bondpad layer 188 is carried out using wet etch chemistry based on phosphoric acid. However, other methods may also be used.

Figure 33:
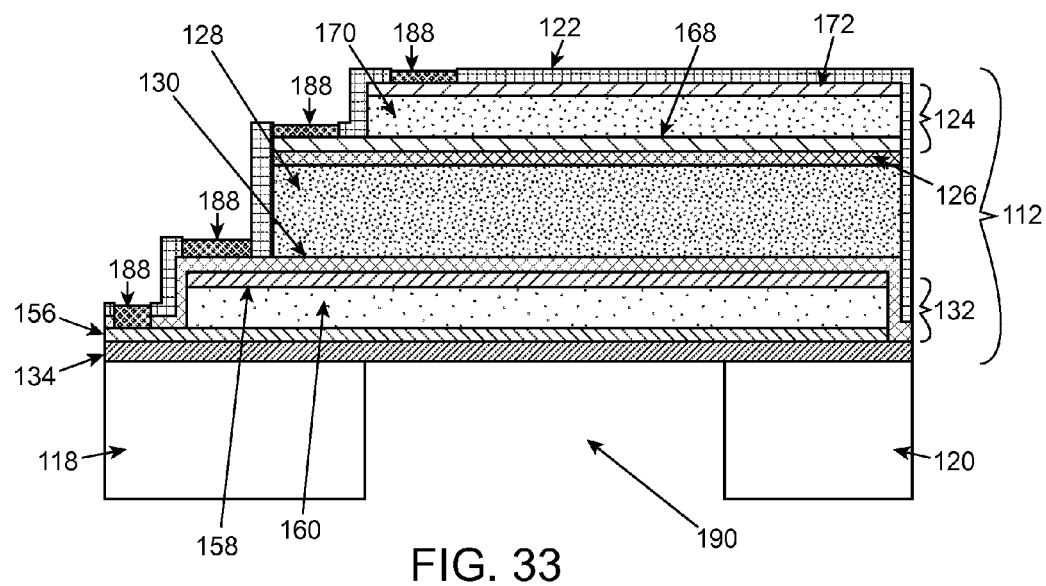
FIG. 33 is a side view of the layered material stack of FIG. 32, in which portions of the of the silicon wafer have been etched to create a resonator beam, a base, and a mass, thus creating one embodiment of the energy harvester device of the present invention which has dual piezoelectric stacks.

The next method step is illustrated in FIG. 33, where silicon wafer 152 is etched at surface 153 to create resonator beam 112, base 118, and mass 120, thus producing one embodiment of the energy harvesting device of the present invention. In other words, portions of silicon wafer 152 are etched away to create a cavity 190 beneath what has become resonator beam 112 to create the separation between the portion of silicon wafer 152 that has become base 118 and portion of silicon wafer 152 that has become mass 120. According to one embodiment, etching silicon wafer 152 is carried out using lithography techniques and deep reactive ion etch with $SF_6/C_4F_8$ chemistry.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. An energy harvester device comprising
an elongate resonator beam extending between first and second ends;
a base connected to said elongate resonator beam at the first end with the second end being freely extending from said base as a cantilever; and
a mass attached to the second end of said elongate resonator beam, wherein said elongate resonator beam comprises either: (1) a first oxide layer on a first piezoelectric stack layer over a cantilever layer on a second oxide layer over a second piezoelectric stack layer on a third oxide layer or (2) a first oxide layer on a first piezoelectric stack layer over a second oxide layer on a cantilever layer over a third oxide layer on a second piezoelectric stack over a fourth oxide layer.

2. The energy harvester device of claim 1, wherein said elongate resonator beam comprises a first oxide layer on a first piezoelectric stack layer over a cantilever layer on a second oxide layer over a second piezoelectric stack layer on a third oxide layer.

3. The energy harvester device of claim 1, wherein said elongate resonator beam comprises a first oxide layer on a first piezoelectric stack layer over a second oxide layer on a cantilever layer over a third oxide layer on a second piezoelectric stack over a fourth oxide layer.

4. The energy harvester device of claim 1, wherein the second piezoelectric stack layer comprises a metal layer over a piezoelectric material layer over a metal layer.

5. The energy harvester device of claim 1, wherein the first piezoelectric stack layer comprises a metal layer over a piezoelectric material layer and the cantilever layer is useful as an electrode.

6. The energy harvester device of claim 1, wherein the first piezoelectric stack layer comprises a metal layer over a piezoelectric material layer on a metal layer.

7. The energy harvester device of claim 1 further comprising:
one or more electrodes in electrical contact with the first and/or second piezoelectric stack layer.

8. The energy harvester device of claim 7 further comprising:
electrical harvesting circuitry in electrical connection with the one or more electrodes to harvest electrical energy from the first and/or second piezoelectric stack layer.

9. The energy harvester device of claim 1, wherein the first and/or second piezoelectric stack layer comprises a layer of metal wherein the metal is selected from the group consisting of molybdenum, platinum, or polysilicon.

10. The energy harvester device of claim 1, wherein the first and/or second piezoelectric stack layer comprises a layer of piezoelectric material, wherein the piezoelectric material is selected from the group consisting of aluminum nitride, zinc oxide, and lead zirconate titinate compounds.

11. The energy harvester device of claim 1, wherein the cantilever is made from a material selected from the group consisting of electroplated copper or nickel, or polysilicon.

12. A system comprising:
an electrically powered apparatus and
the energy harvester device according to claim 1 electrically coupled to the electrically powered apparatus.

13. The system according to claim 12, wherein said electrically powered apparatus is selected from the group consisting of a laptop computer, a tablet computer, a cell phone, a smart phone, an e-reader, an MP3 player, a telephony headset, headphones, a router, a gaming device, a gaming controller, a mobile internet adapter, a camera, wireless sensors, wireless sensor motes, tire pressure sensor monitors, powering simple displays on power tools, devices for raising livestock, medical devices, human body monitoring devices, and toys.

14. The system of claim 12, wherein said elongate resonator beam comprises a first oxide layer on a first piezoelectric stack layer over a cantilever layer on a second oxide layer over a second piezoelectric stack layer on a third oxide layer.

15. The system of claim 12, wherein said elongate resonator beam comprises a first oxide layer on a first piezoelectric stack layer over a second oxide layer on a cantilever layer over a third oxide layer on a second piezoelectric stack over a fourth oxide layer.

16. The system of claim 12 further comprising:
one or more electrodes in electrical contact with the first and/or second piezoelectric stack layer.

17. The system of claim 16 further comprising:
electrical harvesting circuitry in electrical connection with the one or more electrodes to harvest electrical energy from the first and/or second piezoelectric stack layer.

18. A method of powering an electrically powered apparatus, said method comprising:
providing the system according to claim 12;
subjecting the system to movement or vibrations to generate electrical energy from the first and/or second piezoelectric stack layer; and
transferring said electrical energy from the first and/or second piezoelectric stack layer to said apparatus to provide power to the apparatus.

19. The method of claim 18, wherein said apparatus is selected from the group consisting of a laptop computer, a tablet computer, a cell phone, a smart phone, an e-reader, an MP3 player, a telephony headset, headphones, a router, a gaming device, a gaming controller, a mobile internet adapter, a camera, wireless sensors, wireless sensor motes, tire pressure sensor monitors, powering simple displays on power tools, devices for raising livestock, medical devices, human body monitoring devices, and toys.

20. The method of claim 18, wherein said elongate resonator beam comprises a first oxide layer on a first piezoelectric stack layer over a cantilever layer on a second oxide layer over a second piezoelectric stack layer on a third oxide layer.

21. The method of claim 18, wherein said elongate resonator beam comprises a first oxide layer on a first piezoelectric stack layer over a second oxide layer on a cantilever layer over a third oxide layer on a second piezoelectric stack over a fourth oxide layer.

22. The method of claim 18 further comprising:
one or more electrodes in electrical contact with the first and/or second piezoelectric stack layer.

23. The method of claim 22 further comprising:
electrical harvesting circuitry in electrical connection with the one or more electrodes to harvest electrical energy from the first and/or second piezoelectric stack layer.

* * * * *